United States Patent [19]

Handa

[11] Patent Number: 5,465,218
[45] Date of Patent: Nov. 7, 1995

[54] ELEMENT PLACEMENT METHOD AND APPARATUS

[75] Inventor: Keiichi Handa, Kawasaki, Japan

[73] Assignee: Kabushiki Kaisha Toshiba, Kawasaki, Japan

[21] Appl. No.: 194,389

[22] Filed: Feb. 10, 1994

[30] Foreign Application Priority Data

Feb. 12, 1993 [JP] Japan ................................. 5-024469
Mar. 4, 1993 [JP] Japan ................................. 5-043898

[51] Int. Cl.$^6$ ............................................. G06F 17/50
[52] U.S. Cl. ................................... 364/489; 364/488
[58] Field of Search ............................. 364/488, 489, 364/490, 491

[56] References Cited

U.S. PATENT DOCUMENTS

| | | | |
|---|---|---|---|
| 5,224,056 | 6/1993 | Chene et al. | 364/490 |
| 5,225,991 | 7/1993 | Dougherty | 364/491 |
| 5,229,953 | 7/1993 | Isozaki et al. | 364/490 |
| 5,257,201 | 10/1993 | Berman et al. | 364/489 |
| 5,301,318 | 4/1994 | Mittal | 395/600 |

OTHER PUBLICATIONS

IEEE Transactions of Computer–Aided Design, vol. CAD–6, No. 6, James P. Cohoon, et al., "Genetic Placement", 1987, pp. 956–964.

IEICE Technical Report, VLD 90–94, Hisashi Sasaki, et al., "A Placement Algorithm for Analog Cell Generation", 1990, pp. 31–38.

Proc. of an Int. Conf. on Genetic Algorithms and their Applications, Michael P. Fourman, "Compaction of Symbolic Layout using Genetic Algorithms", pp. 141–153.

*Primary Examiner*—Kevin J. Teska
*Assistant Examiner*—Susan Wieland
*Attorney, Agent, or Firm*—Oblon, Spivak, McClelland, Maier, & Neustadt

[57] ABSTRACT

An LSI element placement method of placing elements in accordance with an order in which branches are arranged, each branch being constituted by an element array included in a circuit diagram having first and second terminals, the method including a partial circuit extraction step of sequentially extracting data of a predetermined number of branches included in the circuit diagram from the first terminal side of the circuit diagram so as to overlap the data by a predetermined number, and an element placement step of performing an element placement operation based on a genetic algorithm in the extracted partial circuit data, thereby generating an element placement result including placement coordinate data of all elements included in the partial circuit data.

33 Claims, 11 Drawing Sheets

ELEMENT PLACEMENT METHOD AND APPARATUS

BACKGROUND OF THE INVENTION

1. Field of the Invention

The present invention relates to an automatic element placement system in LSI design and, more particularly, to an element placement method and apparatus in which the positional relationship between elements on a circuit diagram are retained.

2. Description of the Related Art

In LSI design, it is important to place all the elements on a circuit diagram (schematic diagram) within a region having a small area while retaining the positional relationship between the elements to a certain extent. A conventional manual placement scheme can realize such high-density placement but demands skills and a long operation time.

Under the circumstances, automatic element placement apparatuses have been vigorously studied and developed to realize optimal or near-optimal element placement within a short period of time. For example, a procedure of automatic placement is disclosed in Sasaki and Susa, "Element Allocation Method in Generation of Analog Cells", Technical Study Report of the Institute of Electronics and Communication Engineers, VLD90–94, 1990. Many other methods using a genetic algorithm have been proposed.

Genetic algorithm have been proposed as stochastic optimization method s and general purpose search strategies, whose basic concept is based on organic solution processes such as natural selection and recombination mechanisms. A typical genetic algorithm starts with an initial population of solutions, and uses genetic operations such as selection, crossover and mutation to improve upon them.

In such an automatic placement system, however, element placement in an LSI is difficult to optimize (or near-optimize) by performing processing in consideration of the overall circuit arrangement, because an enormous number of elements, e.g., several thousands to several ten thousands' elements, are included in the circuit. Therefore, in a conventional method, an overall circuit is divided into small partial circuits as placement targets, and placement processing is performed in units of partial circuits. In this method, for example, an overall circuit is divided into small partial circuits as placement targets, and placement processing is sequentially performed, in units of partial circuits, from the left or right of the circuit diagram. Although the manner of dividing an overall circuit into partial circuits as placement targets greatly influences a final circuit placement result, a dividing method has not completely established yet, and such a dividing operation is performed by trial and error or an empirically obtained rule. In the case that the circuit diagram is constituted by small partial circuits each having a specific function, a dividing method is established. In addition, there are no satisfactory solutions as to how placement results corresponding to the respective partial circuits as placement targets obtained by a dividing operation are connected to each other efficiently to improve the performance of a placement result corresponding to the overall circuit.

That is, an element placement result provided by a conventional automatic placement system is on a lower level as the (near-) optimal solution, which is not satisfactory as compared with a conventional manual design scheme. There are methods by which a result almost equivalent to that obtained by manual design in terms of integration density can be finally obtained. Such methods, however, are not perfectly automated and require trial-and-error operations, taking a long processing time to obtain a solution.

Sasaki et al. introduce evaluation values associated with constraints such as neighbourhood-relation of elements (the evaluation values of an element placement result will be referred to as "costs" hereinafter) and several types of evaluation functions (to be referred to as "cost functions" hereinafter) for defining a cost associated with the region area occupied by all elements, a cost associated with the overall length of nets among elements, and the like, and they disclose a placement algorithm based on a simulated annealing method to minimize each cost as far as possible. In this case, Sasaki et al. adopt a method of multiplying the cost functions by weighting coefficients corresponding to the significance levels of the respective cost functions, and using the sum of modified the cost functions to evaluate each placement result.

According to Sasaki et al., although the respective cost functions can be ordered in accordance with their significance levels, no method and criterion for quantizing each significance level as a weighting coefficient are disclosed, and such coefficients are empirically set/modified.

Furthermore, in placement algorithms based on genetic algorithms, similar methods have been adopted.

As described above, in the conventional LSI element placement methods, the optimal or near-optimal placement results with respect to all types of cost functions associated with various constraints cannot be obtained.

As a criterion for evaluating the quality of placement result, the degree to which elements are lined up along the x-direction (i.e., horizontally) is checked. This is because alignment of elements in the horizontal direction facilitates wiring and requires only a small unused area. However, no practical method of aligning elements in the lateral direction to a possible extent has been disclosed.

As described above, in the conventional LSI element placement methods, various problems are posed in obtaining a high-quality placement result.

SUMMARY OF THE INVENTION

It is an object of the present invention to provide an LSI element placement method and apparatus for providing a high-quality element placement result, obtained in consideration of an overall circuit, at a high speed.

More specifically, it is the object of the present invention to provide an LSI element placement method and apparatus for providing a high-quality element placement result, obtained in consideration of an overall circuit, at a high speed by (a) providing the optimal or a near-optimal placement result with respect to all cost functions associated with constraints among elements, (b) simultaneously applying genetic algorithms to element placement of the respective partial circuits as placement targets in consideration of the correlation, e.g., the connection relationship or the positional relationship, between adjacent partial circuits as placement targets, and (c) gradually aligning pairs of elements which are adjacent to each other in the lateral direction to reduce an area and facilitate wiring, in the process of executing an algorithm, so as to efficiently obtain a high-quality placement result with excellent alignment characteristics in the lateral direction.

In an LSI element placement method of placing elements in accordance with an order in which branches are arranged, each branch being constituted by an element array included in a circuit diagram having first and second terminals, the LSI element placement method according to the first aspect of the present invention is characterized by comprising: a partial circuit extraction step of sequentially extracting data of a predetermined number of branches included in the circuit diagram from the first terminal side of the circuit diagram so as to overlap the data by a predetermined number; and an element placement step of performing an element placement operation based on a genetic algorithm on the extracted partial circuit, thereby generating an element placement result including placement coordinate data of all elements included in the branch data.

In an LSI element placement apparatus for placing elements in accordance with an order in which branches are arranged, each branch being constituted by an element array included in a circuit diagram having first and second terminals, the LSI element placement apparatus according to the first aspect of the present invention is characterized by comprising: partial circuit data extraction means for sequentially extracting data of a predetermined number of branches included in the circuit diagram from a first terminal side of the circuit diagram so as to overlap the data by a predetermined number; and element placement means for performing an element placement operation using a genetic algorithm with respect to the branch data extracted by the partial circuit data extraction means, thereby generating an element placement result including placement coordinate data of all elements included in the branch data.

In the LSI element placement method and apparatus according to the first aspect of the present invention, elements are placed with respect to a partial circuit as a placement target constituted by a predetermined number of branches (e.g., $m$ branches), throughout an overall circuit, while branches smaller in number than the branches of the partial circuit (e.g., $(m-n)$ branches) are used as a common portion. Therefore, according to the LSI element placement method and apparatus of the first aspect of the present invention, since local optimization is continuously performed, element placement can be performed in consideration of the overall circuit. In cooperation with an element placement method using genetic algorithms based on the characteristics of branches, a high-quality element placement result exhibiting a high integration density per unit element area can be efficiently obtained, in case of using an area occupied by the placed elements as the cost function.

In an LSI element placement method according to the first aspect of the present invention, the element placement step is characterized by including a selection step of selecting $n$ solutions of the next population from the present population consisting of $n$ solutions. Here $n$ is a predetermined number. The selecting step is characterized by including an evaluation step of evaluating each solution of the present population using several costs including at least a first cost associated with the region area occupied by elements and a second cost associated with a positional relationship between elements, a first generation step of calculating a selection probability of each solution by using a predetermined function on the basis of the first cost, and selecting a population of used to retain the hierarchical relationship between the elements of a branch to a possible extent, solutions $n_1$ larger in number than $n$ from the present a population of $n$ solutions, a second generation step of calculating a selection probability of each solution by using a predetermined function on the basis of the second cost, and selecting a second population of $n_2$ solutions larger in number than population and smaller in number than $n_1$ from the first population and a third generation step of repeating the second generation step until final a population of $n$ solutions are generated with reference to all costs.

In the LSI element placement apparatus according to the first aspect of the present invention, the element placement means is characterized by including selection means of selecting $n$ solutions of the next population from the resent population consisting of $n$ solutions. Here $n$ is a predetermined number. The selection means is characterized by including evaluation means for evaluating each solution of the present population using several costs including at least a first cost associated with the region area occupied by elements and a second cost associated with a positional relationship between elements in units of the first solutions, first generation means for calculating a selection probability of each solution by using a predetermined function on the basis of the first cost, and selecting a first population of $n_1$ solutions larger in number than $n$ from the present population of $n$ solutions, second generation means for calculating a selection probability of each solution by using a predetermined function on the basis of the second cost, and selecting a second population of $n_2$ larger in number than $n$ and smaller in number than $n_1$ from the first population and means for repeatedly operating the second generation means until final population of $n$ solutions are generated with reference to all costs.

According to the above-described LSI element placement method and apparatus, a genetic algorithm is used as an optimization method. In selecting a population of solutions in each generation after costs of each solution are evaluated, cost functions are used in the order of significance levels to screen solutions to converge on a better solutions. Therefore, the optimal or near-optimal solution with respect to all the cost functions can be obtained.

In an LSI element placement method of placing elements in accordance with an order in which branches are arranged, each branch being constituted by an element array included in a circuit diagram having first and second terminals, the LSI element placement method according to the second aspect of the present invention is characterized by comprising: a division step of dividing the circuit diagram into a plurality of partial circuits, each constituted by a plurality of branches; and a parallel processing step of simultaneously applying genetic algorithms to element placement of the respective partial circuits, wherein the parallel processing step includes a step of obtaining fitness used for the genetic algorithms with respect to the respective partial circuits with reference to information about a connection relationship between elements of each partial circuit as a placement target, and information about a placement result based on a best solution every predetermined number of generations of the immediately left partial circuit as a placement target.

In an LSI element placement apparatus for placing elements in accordance with an order in which branches are arranged, each branch being constituted by an element array included in a circuit diagram having first and second terminals, the LSI element placement apparatus according to the second aspect of the present invention is characterized by comprising: means for dividing the circuit diagram into a plurality of partial circuits, each constituted by a plurality of branches; and processing means for simultaneously applying genetic 10 algorithms to element placement of the respective partial circuits, wherein the processing means includes means for obtaining fitness used for the genetic algorithms with respect to the respective partial circuits with reference to information about a connection relationship between elements of each partial circuit as a placement target, and information about a placement result based on a best solution every predetermined number of generations of the immediately left partial circuit as a placement target.

In the LSI element placement method and apparatus according to the second aspect of the present invention, an overall circuit is divided into partial circuits as placement targets, each constituted by a plurality of branches, and genetic algorithms based on the characteristics of the respective branches are simultaneously applied to element placement of the respective partial circuits as the placement targets while considering the correlation between adjacent partial circuits by referring to not only information about the connection relationship between the elements each partial circuit but also information about a placement result based on the best solution obtained at an interval of a previously designated number of generations. Therefore, a high-quality placement result can be obtained at a high speed in consideration of the overall circuit.

An LSI element placement method according to the third aspect of the present invention is characterized in that the element placement step of the first aspect includes a population of solutions generation step of using the branch data extracted in the partial circuit extraction step to generate a population of solutions including a plurality of solutions constituted by candidate values for predetermined first coordinates of all elements included in the branch data, a second coordinate determination step of determining second coordinates orthogonal to the first coordinates of all elements associated with the a population of solutions in units of solutions by a compaction operation, a search step of searching a pair of elements for each solution of the a population of solutions, of elements included in the adjacent branches, which have the first coordinates which are close to each other, in accordance with a predetermined probability, and an adjustment step of, when a pair of elements which are close to each other are found, adjusting first coordinate values of the elements to be equal to each other.

An LSI element placement apparatus according to the third aspect of the present invention is characterized in that the element placement means of the first aspect includes a population of solutions generation means for using the branch data extracted by said partial circuit data extraction means to generate a population of solutions including a plurality of solutions constituted by candidate values for predetermined first coordinates of all elements included in the branch data, second coordinate determination means for determining second coordinates orthogonal to the first coordinates of all elements associated with the a population of solutions in units of solutions by a compaction operation, search means for searching a pair of elements for each solution of the a population of solutions, of elements included in the adjacent branches, which have the first coordinates which are close to each other, in accordance with a predetermined probability, and adjustment means for, when a pair of elements which are close to each other are found, adjusting first coordinate values of the elements to be equal to each other.

In the LSI element placement method and apparatus according to the third aspect of the present invention, when genetic algorithms based on the characteristics of branches are to be used for automatic placement of the elements of an LSI, the following operation is performed as one of genetic operations. For each code (chromosome) of solutions in each generation, pairs of elements, in adjacent branches, whose y-coordinates are close to each other are searched in accordance with a predetermined probability designated. If such a pair is searched out, the y-coordinates of the two elements are set to be the same value. With this operation, since pairs of elements which are adjacent to each other in the lateral direction to reduce an area and facilitate wiring are gradually aligned in the x direction, finally, a high-quality placement result having good alignment characteristics in the x direction can be efficiently obtained.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Embodiments of the present invention will be described below with reference to the accompanying drawings.

Figure 1:
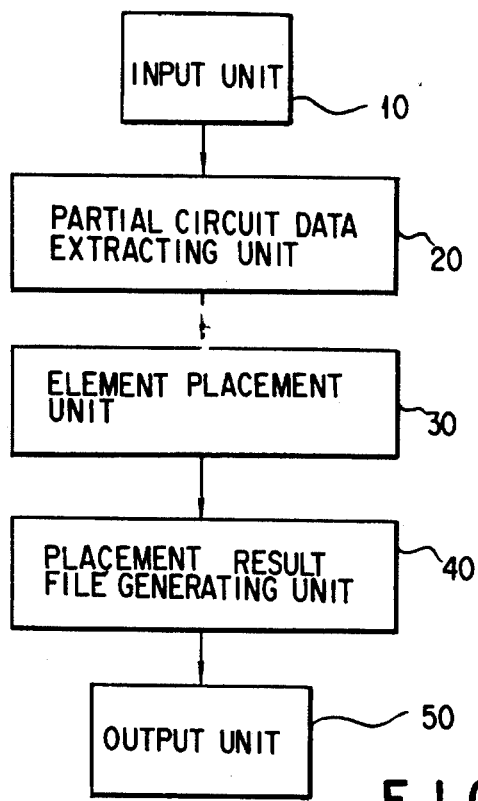
FIG. 1 is a block diagram showing the arrangement of an LSI element placement apparatus according to the first embodiment of the present invention.

FIG. 1 is a block diagram showing the schematic arrangement of an LSI element placement apparatus according to the first embodiment of the present invention.

This LSI element placement apparatus roughly comprises an input unit 10, a partial circuit data extracting unit 20, an element placement unit 30, a placement result file generating unit 40, and an output unit 50. The input unit 10 serves to input a placement target, and has a storing section (not shown) for storing the input placement target. The partial circuit data extracting unit 20 can access the storing section. The element placement unit 30 is coupled to the output stage of the partial circuit data extracting unit 20. The placement result file generating unit 40 is coupled to the output stage of the element placement unit 30. The output unit 50 outputs the contents of a placement result file generated by the placement result file generating unit 40.

The operation of the LSI element placement apparatus shown in FIG. 1 will be described. As an element placement target, the circuit diagram shown in FIG. 2 is used.

In the following description, a "branch" means an element array constituted by several elements coupled between a source line and a ground line in a circuit diagram. This branch is the minimum unit to be treated in automatic element placement.

Figure 2:
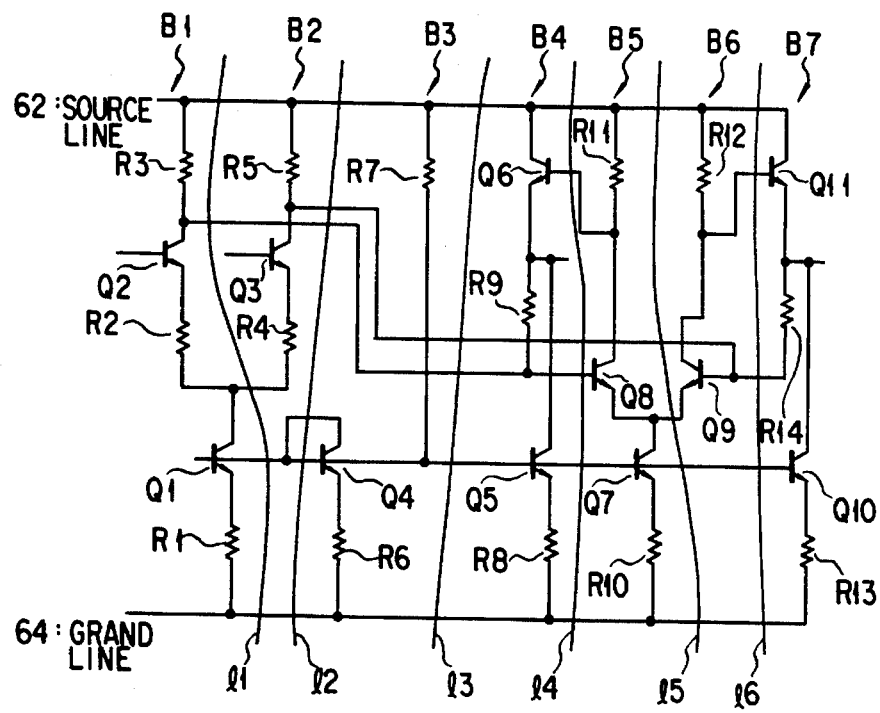
FIG. 2 is a circuit diagram to which the LSI element placement apparatus of the present invention is applied.

For example, in the circuit shown in FIG. 2, first to seventh branches B1 to B7 generated by dividing the circuit by curves 11 to 16 are shown. For example, the first branch B1 consists of five elements R1, Q1, R2, Q2, and R3 constituting a current path between a source line 62 and a ground line 64; the second branch B2 consists of elements R4, Q3, and R5 which do not reach the ground line 64; and the seventh branch B7 consists of R13, Q10, R14, and Q11 with the element R14 branch-connected between the source line 62 and the ground line 64.

The operation procedure of the LSI element placement apparatus in FIG. 1 will be briefly described first. The LSI element placement apparatus shown in FIG. 1 determines the placement coordinates belonging to n (<m) branches on the left end of the circuit diagram by a method using a genetic algorithm (to be described in detail later) on the basis of a partial circuit as a placement target constituted by m branches on the left end of the circuit diagram. The partial circuit as the placement target is then slid to the right side by an amount corresponding to n branches so as to determine the placement coordinates of elements belonging to the next n branches by in the same manner as described above. By repeating this operation, the entire circuit is scanned by the partial circuit as the placement target, and placement of all the elements is executed.

The detailed operation procedure will be described below with reference to FIG. 3.

Data concerning a circuit diagram as a placement target, e.g., the sizes and types of elements, a net list, and branch information, are read from the input unit 10 (step A1). In this case, the branch information may be manually designated on the circuit diagram by a designer in advance, or may be set by the partial circuit data extracting unit 20 after step A2.

Figure 4:
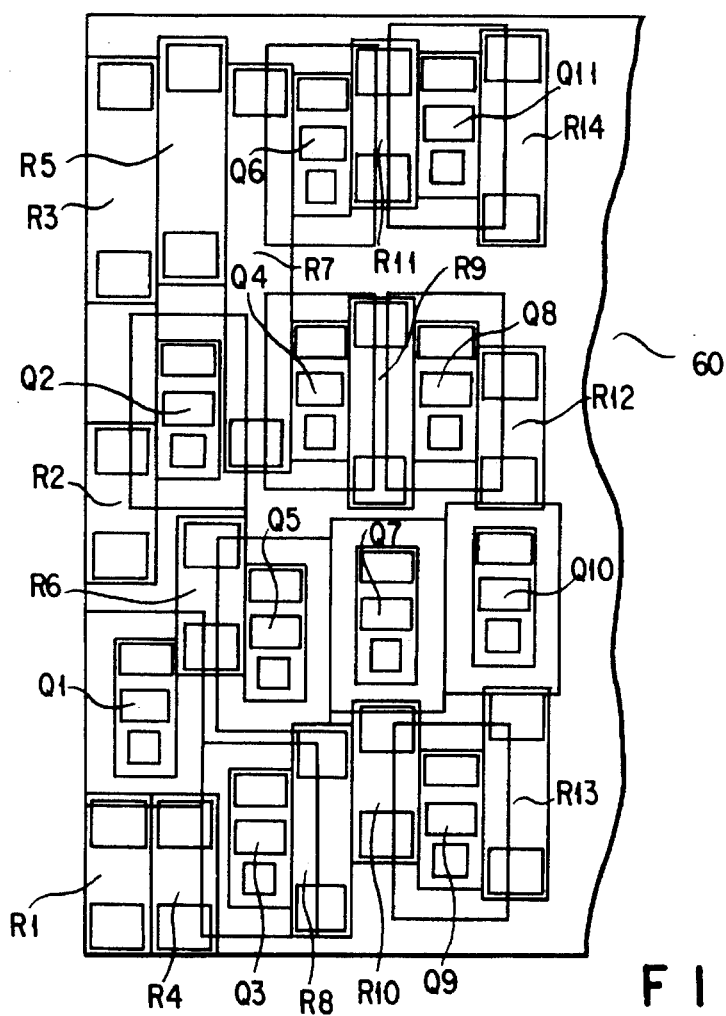
FIG. 4 is a view showing an automatic placement result corresponding to the circuit diagram shown in FIG. 2, which result is obtained by using the LSI element placement apparatus of the present invention.

A user operates the input unit 10 to set parameters $\underline{m}$ and $\underline{n}$ (to be described in detail later), parameters concerning the element placement unit 30, and a height of an available placement area 60 (width thereof being particularly unspecified) for the elements, shown as an outer frame in FIG. 4 which shows an example of the automatic placement result of the circuit diagram in FIG. 2 which is obtained by the LSI element placement system of the present invention (step A2).

The partial circuit data extracting unit 20 then determines a circuit constituted by a predetermined number of branches (m branches in this case) on the left end of the circuit diagram, as a partial circuit to be placed (step A3). In this embodiment, for the sake of descriptive convenience, it is assumed that m=5. For example, in the circuit shown in FIG. 2, a circuit constituted by the first to fifth branches B1 to B5 is determined as a partial circuit to be placed.

The partial circuit data extracting unit 20 receives data concerning the partial circuit determined in step A3 from the input unit 10 (step A4).

The element placement unit 30 performs automatic placement with respect to all elements included in the partial circuit by an element placement method using a genetic algorithm (to be described in detail later) on the basis of the data concerning the partial circuit, extracted in step A4 (step A5).

Of the solutions obtained in step A5, i.e., the placement coordinates of all the elements included in the partial circuit, only the placement coordinates of elements belonging to $\underline{n}$ branches on the left end of the partial circuit are recorded, as final placement coordinates, on a placement result file by the placement result file generating unit 40 (step A6).

That is, according to the embodiment, if n=2, in this embodiment, only the placement coordinates of the sets of the elements R1, Q1, R2, Q2, and R3 and the elements R4, Q3, and R5 respectively included in the first and second branches B1 and B2, of the first to fifth branches B1 to B5 constituting the partial circuit, are determined as the final coordinates of these elements. At this time, with respect to the elements belonging to the third to fifth branches B3 to B5, final placement coordinates are not determined.

If the number of unprocessed branches which have undergone no placement processing in step A5 is not "0", steps A4 to A6 are repeated; or if the number of unprocessed branches is "0", the flow advances to step A9 (step A7).

The partial circuit data extracting unit 20 removes the n branches, in which the coordinates of the respective elements have been determined in step A6, from the partial circuit, and adds sequentially n branches of unprocessed branches which have undergone no processing in step A5, from the left side, to the remaining portion (i.e., the (m–n) branches for which determination of placement coordinates is deferred. The resultant portion is determined as a new partial circuit serving as a placement target constituted by $\underline{m}$ branches (step A8).

In step A8, for example, sixth and seventh branches as unprocessed branches are added to the third to fifth branches B3 to B5, for which determination of placement coordinates is deferred, and a new partial circuit constituted by the five branches, i.e., the third to seventh branches B3 to B7, is determined as the next placement target.

Whenever step A8, in which a partial circuit as a placement target is updated, to step A6, in which the placement coordinates of elements are determined, are repeated, and the flow circulates through this processing loop once, the placement coordinates of elements belonging to new n branches are determined.

If it is determined in step A7 that the number of unprocessed branches is "0", the placement result file generating unit 40 determines the placement coordinates of all the remaining elements, for which determination of placement coordinates is deferred in step A6, as the final placement coordinates, and records the corresponding data in the placement result file (step A9). With this procedure, the placement coordinates of all the elements included in the circuit as the placement target are determined, thereby completing the placement result file.

In step A9, for example, in the circuit shown in FIG. 2, the placement coordinates of the elements included in the third and fourth branches B3 and B4, of the third to seventh branches B3 to B7 included in the partial circuit set as the placement target at the second execution of step A6, are determined as the final placement coordinates, while determination of the final coordinates is deferred with respect to the coordinates, as placement results, of the elements included in the three branches, i.e., the fifth to seventh branches B5 to B7. The coordinates, as the placement results, of the elements included in the fifth to seventh branches B5 to B7, for which determination have been deferred, are determined as the final placement coordinates in step A9.

The output unit 50 outputs the contents of the placement result file to a predetermined device (step A10). As the output unit 50, any one of the following media can be used: a monitor screen, a printer, a data communication network, and an information storage medium.

If the number of unprocessed branches is not $\underline{n}$, and the number of branches included in a partial circuit as a new placement target is not $\underline{m}$ in step A8, i.e., step A8 as the last step, after the above-described processing loop is executed a predetermined number of times, the subsequent processing may be performed in accordance with the corresponding numbers.

The procedure may be executed again upon changing part or all of the parameters set in step A2 by using the data stored in the storing section of the input unit 10. In this case, step A1 is not required. In addition, the parameters $\underline{m}$ and $\overline{\underline{n}}$ may be locally changed, as needed, in accordance with the characteristics of a circuit diagram, instead of keeping the parameters constant.

Figure 3:
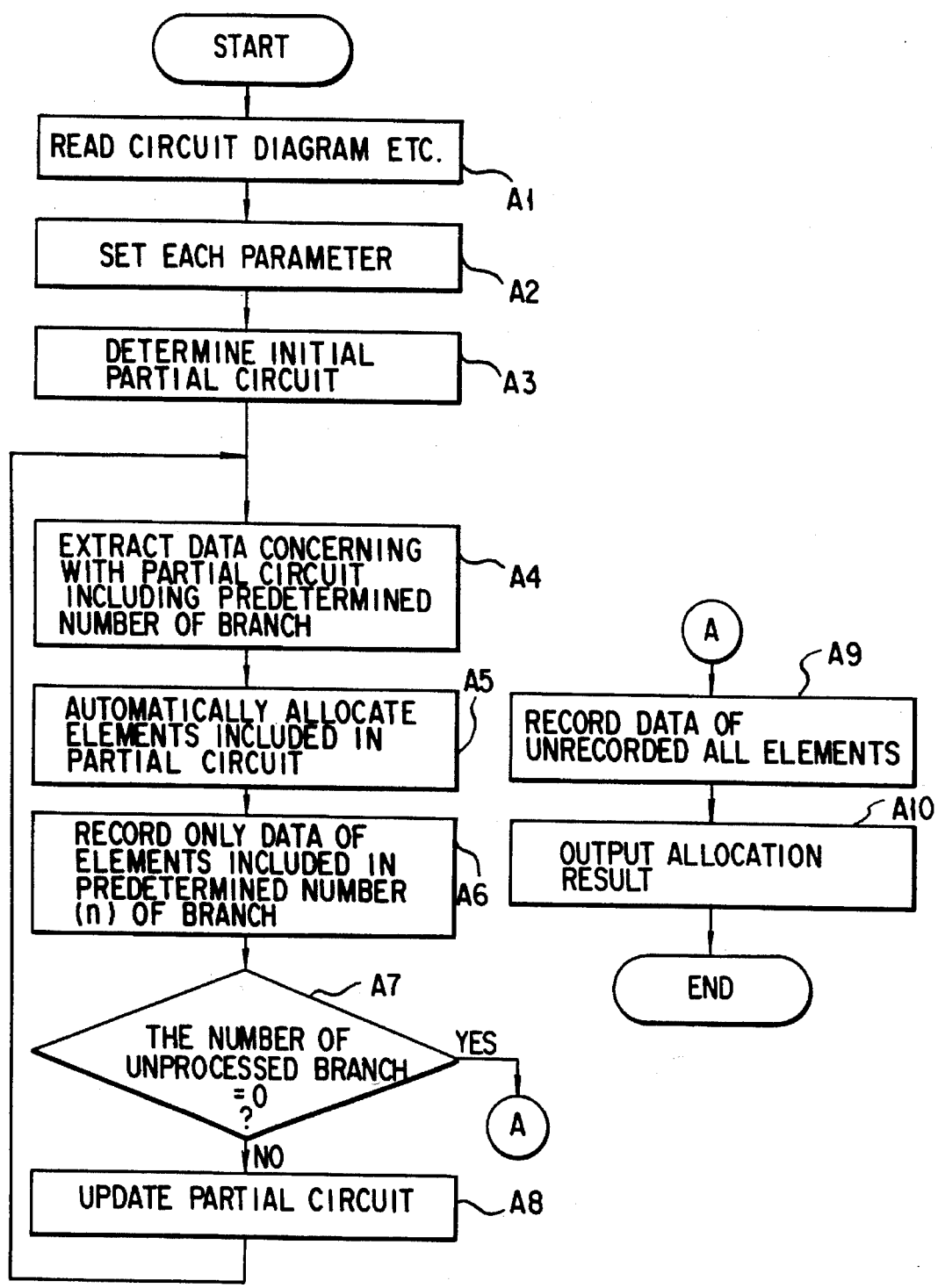
FIG. 3 is a flow chart showing the operation of the element placement apparatus shown in FIG. 1.

The operation of the first embodiment which is shown in FIG. 3 is an example and can be modified, as needed. For example, step A7 may be set before step A6 so that when YES is obtained in step A7, an operation equivalent to a combination of steps A6 and A9, i.e., recording of a placement result concerning all the elements, obtained in step A5, may be performed. With this arrangement, the same effect as described above can be obtained.

As described above, according to the first embodiment of the present invention, element placement is performed while an entire circuit is scanned with a partial circuit as a placement target having a common portion. Therefore, unlike the prior art, placement can be performed in consideration of the overall circuit in terms of continuation of local optimization.

Figure 5:
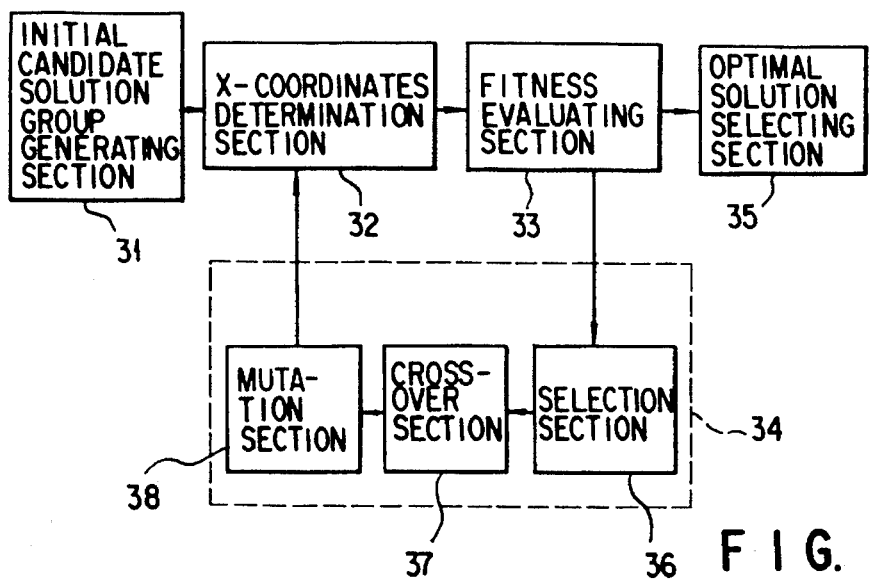
FIG. 5 is a block diagram showing the schematic arrangement of an element placement unit 30.

FIG. 5 shows the schematic arrangement of the element placement unit 30.

The element placement unit 30 comprises an initial a population of solutions generating section 31 for relating a partial circuit as a placement target, an x-coordinates determination section 32 coupled to the output stage of the initial a population of solutions generating section 31, a fitness evaluating section 33 coupled to the x-coordinates determination section 32, a population of solutions updating section 34 coupled to the fitness evaluating section 33 and designed to supply data to the x-coordinates determination section 32, and an optimal or near-optimal solution selecting section 35 coupled to the fitness evaluating section 33 and designed to select and output an optimal or near-optimal solution. The a population of solutions updating section 34 comprises a selection section 36, a crossover section 37, and a mutation section 38.

Prior to a description of the operation of the element placement unit 30, terms used in the following description will be defined.

Genetic algorithms have been proposed as stochastic optimization method s and general purpose search strategies, whose basic concept is based on organic solution processes such as natural selection and recombination mechanisms. A typical genetic algorithm starts with an initial population of solutions, and uses genetic operations such as selection, crossover and mutation to improve upon them.

A "solution" is a candidate for the solution to a given problem and is constituted by a sequence of numbers or a data sequence, e.g., [1, 0, 0, 0] or [A, B, C, D]. In the first embodiment, a solution is a sequence of numbers representing candidate values for the y-coordinates of elements to be placed. In detail, each solution is represented by a sequence of numbers (called a chromosome or code of a solution) obtained by arranging and coding candidate values for the y-coordinates of reference points of the respective elements (e.g., points on the lower left ends of the respective elements) included in a circuit diagram in accordance with the order, in which branches are arranged, from the left side in the circuit diagram, and the order in which the elements of each branch are arranged upward on the circuit schematic.

A "solution" is a candidate of solution for a given problem, and, for example, consists of numerical series or data series such as {1, 0, 0, 0} or {A, B, C, D}. In the first embodiment, the "solution" is the numerical series of Y-coordinates of element to be placed.

A "a population of solutions" is a group of solutions.

An "initial solution" is the initial value of a solution.

A "fitness" is the evaluation value of each solution as a solution calculated by a predetermined evaluation function (referred to as a "fitness" function hereinafter) based on a cost and the like. The larger fitness becomes better solution. The fitness may be relatively defined among each solution of the corresponding generation in each generation.

"Selection" is an operation of selecting two solutions from all solutions on the basis of probabilities proportional to fitnesses.

"Crossover" is an operation of exchanging some components of selected two solutions with each other on the basis of a predetermined rule. Two new solutions are generated by this crossover.

"Mutation" is an operation of performing a predetermined arithmetic operation with respect to only a given component of a given solution on the basis of a predetermined probability. This mutation serves to prevent a search range from being limited by an initial a population of solutions.

The operation procedure of the element placement unit 30 will be briefly described below.

The element placement unit 30 repeatedly executes the following procedure: generating a population of solutions of an initial generation consisting of a plurality of solutions by a method to be described later; evaluating each solution; generating a new a population of solutions consisting of the same number of solutions as that of the first generation, i.e., a population of solutions of a new generation, by a procedure to be described later; evaluating the a population of solutions of the new generation; generating a population of solutions of a still new generation; and evaluating the a population of solutions of the still new generation. This procedure is repeatedly executed until a certain condition is satisfied to finally select one solution as the solution to this element placement problem.

An element placement procedure (i.e., step A5) performed by the element placement unit 30 using a genetic algorithm will be described in detail below with reference to FIG. 6.

The initial a population of solutions generating section 31 generates a population of solutions of an initial generation (step B1). In generating the a population of solutions of the initial generation, the initial a population of solutions generating section 31 executes different operations in the first execution of the procedure and the subsequent execution thereof. The operation in the first execution of the procedure will be described first.

In the first execution of the procedure, the partial circuit data extracting unit 20 supplies extracted data about the elements belonging to a partial circuit as a placement target to the initial a population of solutions generating section 31 for the first time. The initial a population of solutions generating section 31 generates a predetermined number of solutions representing the candidate values of the y-coordinates of the elements in accordance with the order in which the branches belonging to the partial circuit are arranged from the left side on the circuit diagram, and the order in which the elements in each branch are arranged upward on the circuit diagram. A group consisting of a plurality of solutions generated in this manner is a population of solutions of an initial generation.

The above operation will be described in detail below with reference to FIG. 2.

First, the initial a population of solutions generating section 31 randomly generates y-coordinates (e.g., 11, 14, 23, 28, 37) of the elements belonging to the first branch B1, located on the left end of the partial circuit constituted by the first to fifth branches B1 to B5 to be automatically placed, in the order of the element R1, located at the lowermost position in the first branch B1, to the element R3, located at the uppermost position in the first branch B1. Subsequently, similar processing is performed up to the fifth branch B5. The initial a population of solutions generating section 31 then generates one solution by coupling all the generated candidate values for the y-coordinates in the generating order.

An integer equal to or larger than 0 and equal to or smaller than 49 is used as a y-coordinate in the above embodiment, an integer equal to or larger than 0 and equal to or smaller than 41 may be used as a y-coordinate in consideration of falling outside the available placement area (In an example of FIG. 2, an element having y-coordinates of equal to or lager than 2 falls outside the available placement area). In this condition, an element having large height such as an element R7 shown in FIG. 2 may fall outside the available placement area (Actually, a capable value of y-coordinates of element R7 is equal to or larger than 0 and equal to or smaller than 28). In this case, an allocation of an element can be corrected to allocate the element just in the available placement area (For example, when a value 35 is assigned to the element R7, the value of the y-coordinates is corrected to 28).

The following is an example of the a population of solutions generated by the initial a population of solutions generating section 31:

| candidate solution 1: | 11 14 23 28 37; 7 19 24; 15 31 28; 0 10 21 29; 7 18 27 37 |
|---|---|
| candidate solution 2: | 0 17 31 34 37; 18 36 37; 17 26 28; 2 3 26 27; 4 9 15 26 |
| candidate solution 3: | 16 18 33 36 37; 4 16 22; 22 23 24; 19 21 26 34; 14 14 25 26 |
| candidate solution 4: | 5 15 24 27 28; 2 3 30; 1 12 27; 7 9 20 30; 1 3 10 20 |

One solution has candidate values for 19 y-coordinates corresponding to the 19 elements included in the partial circuit as the placement target. In each sequence of numbers, the respective numbers correspond to R1, Q1, R2, Q2, R3, R4, Q3, R5, ... in accordance with the order in which the numbers are arranged from the left to the right. The semicolons in each sequence of numbers are signs which simply indicate the limits of the branches and are added just for the sake of descriptive convenience, but are not character data included in a solution.

In this case, generation of y-coordinates may be performed by using random values generated within an allowable range determined in consideration of the available placement area 60 of the elements, the type and size of each element, a design rule, and the like.

In the above-described manner, generation of a population of solutions is performed in the first execution of the procedure. The operation from the second execution of the procedure will be described next.

The partial circuit data extracting unit 20 supplies data about the elements included in a partial circuit as a new placement target, obtained by moving the partial circuit as the first placement target to the right by an amount corresponding to n branches, to the initial a population of solutions generating section 31. The initial a population of solutions generating section 31 determines a group consisting of a predetermined number of solutions as a population of solutions of the initial generation.

In this case, the initial a population of solutions generating section 31 does not randomly generate a population of solutions with respect to all the associated elements as in the first operation. More specifically, with respect to the y-coordinates of the elements belonging to (m-n) branches corresponding to the common portion between the partial circuit as the current placement target and the partial circuit as the previous placement target, the initial a population of solutions generating section 31 receives the values of the corresponding y-coordinates in the a population of solutions obtained by the last execution of step A5 as the automatic element placement step, and succeeds them without any modification, thereby generating a population of solutions. Succession of these values is between the new and old solutions having the same numbers. With respect to newly added $\underline{n}$ branches, the values of the corresponding y-coordinates are generated by the same method as that used in the first operation.

The second and subsequent operations of generating initial a population of solutions, performed by the initial a population of solutions generating section 31, will be described in detail below with reference to FIG. 2.

When an initial a population of solutions for the partial circuit as the second placement target is to be generated, the partial circuit to be subjected to automatic placement is the partial circuit as the placement target constituted by the third to seventh branches B3 to B7. The partial circuit which has undergone automatic placement is the partial circuit as the placement target constituted by the first to fifth branches B1 to B5. Therefore, three branches corresponding to the common portion between the partial circuits as the new and old placement targets are the third to fifth branches B3 to B5. For this reason, with respect to candidate values, of the current solution, set for the y-coordinates of the elements included in the third to fifth branches B3 to B5, the values of the corresponding portions of the initial solution are received and succeeded without any modification. With respect to the newly added sixth and seventh branches B6 and B7, candidate values are generated in the same method as in the initial operation described above.

If, for example, solution 1 in the initial operation is represented as:

| B1 | B2 | B3 | B4 | B5 |
|---|---|---|---|---|
| 1 6 15 23 35; | 15 25 34; | 1 9 26; | 1 12 26 32; | 3 11 23 39 | then, solution 1 in the second operation is represented as:

| B3 | B4 | B5 | B6 | B7 |
|---|---|---|---|---|
| 1 9 26; | 1 12 26 32 | 3 11 23 39 | 9 36; | 10 16 37 39 |

If solution 2 in the initial operation is represented as:

| B1 | B2 | B3 | B4 | B5 |
|---|---|---|---|---|
| 1 9 18 23 35; | 15 27 37; | 4 12 25; | 0 14 28 38; | 2 8 25 37 | then, solution 2 in the second operation is represented as:

| B3 | B4 | B5 | B6 | B7 |
|---|---|---|---|---|
| 4 12 25; | 0 14 28 38; | 2 8 25 37; | 17 25; | 3 6 29 33 |

In this case, the reference numerals above each solution indicate the corresponding branches.

The x-coordinates determination section 32 determines the x-coordinate of each element which has not been determined in step B1 by using a compaction (step B2). In this case, the compaction method will be explained by using so-called one-order compaction described in a reference, e.g., Sasaki et al. One-order compaction is a method of sequentially moving the elements included in the branches of a partial circuit as a placement target, on by one, from the branch located on the left side in the partial circuit and from the element located at the lowermost position in each branch, or preferentially from an element connected to an element on the left side, in the -x direction, i.e., to the left in the horizontal direction, thereby placing the elements as if they were compacted. In the case of parallelly moving the element to the left side of the available placement area, the further compacted allocation can be performed by a small movement of y direction (i.e., small upper or lower movement), if the element can be moved to the further left side of the available placement area by a small movement of y direction.

The range in which elements can be arranged by this compaction may be determined by the coordinates of placed elements, stored in the above-mentioned placement result file, the available placement area of the elements, a design rule, and the like.

As a constraint associated with compaction, the elements belonging to a moving branch may be added the condition for placing to be compacted to the left side within the range in which the x-coordinates are not set on the left side of the x-coordinates of elements which belong to a branch already placed at one (or two) previous placement and are located at the leftmost position. In this case, the positional relationship between the elements on the circuit diagram is retained in a good state.

The fitness of each solution is calculated by the fitness evaluating section 33 in accordance with a predetermined evaluation function (step B3). When a right end coordinates of rightmost element (which occupying a rightmost side area of the available placement area) of compaction of all elements belonging to the partial circuit of the placement target is taken into consideration, the value of the cost can be used, as one of evaluation indexes, in an evaluation function. For example, therefore, a fitness $f(w)$ of a solution $w$ may be defined as follows:

$$f(w)=(\text{maximum value of areas provided by all solutions of current generation})-(\text{area of solution } w)$$

An order cost using to store an upper or lower relationship among the elements in a branch, or the like, added to the cost associated with the area, is necessary. The detailed explanation of those costs will be explained in the second embodiment, and is omitted.

If it is determined in step B4 that the number of times the processing loop is executed is smaller than a predetermined number set in step A2, steps B5 to B8 are repeated to generate a new a population of solutions.

In step B5, the selection section 36 selects two solutions to be subjected to a crossover operation from all the solutions in accordance with a selection probability determined by the fitness of each solution. The two selected solutions are set as parent 1 and parent 2, respectively.

In this case, for example, a selection probability $P(w)$ of the solution $w$ may be given by $$P(w)=f(w)/(\text{sum of all fitness } f)$$

The following selection method may be employed. First, real-number section [0,1) is divided to a numerical range in accordance with selection probability of each solution (For example, [0, 0.1), [0.1, 0.3) ..., [0.97, 1)). Then, solutions corresponding to numerical range including random numbers uniformly occurring in [0, 1) may be selected (For example, if the random number is 0.15, the second solution is selected).

In this case, if solution 1 is selected first, and then solution 4 is selected by predetermined random numbers, solution 1 and solution 2 are respectively set as parent 1 and parent 2 as follows:

| parent 1: | 11 14 23 28 37; 7 19 24; 15 31 28; 0 10 21 29; 7 18 27 37 |
|---|---|
| parent 2: | 5 15 24 27 28; 2 3 30; 1 12 27; |

-continued 7 9 20 30; 1 3 10 20

In step B6, the crossover section 37 performs a crossover operation of exchanging components of selected parent 1 and parent 2 with each other to generate child 1 and child 2 as new candidate solutions.

A crossover operation is performed in units of branches included in the two selected solutions as follows.

Whether a crossover operation is to be performed is determined first in accordance with preset crossover ratios set in units of branches in advance. In this case, the crossover ratios of the respective branches may be set such that lower values are set as the positions of the branches become closer to the left end, like, e.g., 0.2, 0.2, 0.5, 0.5, and 0.8.

A crossover operation is executed only between the branches for which execution of a crossover is determined.

There are various methods of performing a crossover. A method of performing a uniform crossover will be described below. In a uniform crossover, mask patterns, each having a length equivalent to the number of elements belonging to a corresponding branch, are generated by using a means for generating "0"s and "1"s at the same probability, and components corresponding to "1"s on the mask patterns are exchanged with each other between parent 1 and parent 2.

The following is a case wherein a uniform crossover is performed with respect to the second, fourth, and fifth branches from the left. Assume that the mask patterns generated in this case are: "010", "1101", and "0011".

|  |  |  |  |
|---|---|---|---|
| parent 1: | 11 14 23 28 37; | 7 19 24; | 15 31 28; |
| parent 2: | 5 15 24 27 28; | 2 3 30; | 1 12 27; |
| crossover: | no | yes | no |
| mask pattern |  | 010 |  |
| child 1: | 11 14 23 28 37; | 7 3 24; | 15 31 28; |
| child 2: | 5 15 24 27 28; | 2 19 30; | 1 12 27; |
| parent 1: | 0 10 21 29; | 7 18 27 37 |  |
| parent 2: | 7 9 20 30; | 1 3 10 20 |  |
| crossover: | yes | yes |  |
| mask pattern | 1101 | 0011 |  |
| child 1: | 7 9 21 30; | 7 18 10 20 |  |
| child 2: | 0 10 20 29; | 1 3 27 37 |  |

The mutation section 38 performs a mutation operation, i.e., an arithmetic operation, with respect to child 1 and child 2 generated in this manner (step B7)

This mutation is performed in units of branches included in the respective solutions as follows.

Whether mutation is to be performed is determined in accordance with mutation ratios set in units of branches in advance. Similar to the crossover ratios, the mutation ratios of the respective branches may be set such that lower values are set as the positions of the branches become closer to the left end, like 0.1, 0.1, 0.3, 0.3, and 0.5.

A mutation operation is executed only between the branches for which execution of mutation is determined.

Although various methods of performing mutation can be considered, mutation may be performed by a method of adding a small value a to the value of one component randomly selected from a branch. In this case, as the value α, for example, one of (+3, +2, +1, −1, −2, −3) is randomly selected for each mutation operation. In this case, however, if the value of a component falls outside the available placement area when it is increased by +3, one of the remaining values is selected again.

The following is a case wherein mutation occurs for the third and fifth branches from the left in child 1. In the following example, −2 is added to the first component of the third branch, and +1 is added to the fourth component of the fifth branch.

With regard to child 1,

|  |  |  |  |
|---|---|---|---|
| child 1: | 11 14 23 28 37; | 7 3 24; | 15 31 28; |
| mutation: | no | no | yes in first component |
| child 1': | 11 14 23 28 37; | 7 3 24; | 13 31 28; |
| child 1: | 7 9 21 30; | 7 18 10 20 |  |
| mutation: | no | yes in fourth component |  |
| child 1': | 7 9 21 30; | 7 18 10 21 |  |
| With regard to second child, |  |  |  |
| child 2: | 5 15 24 27 28; | 2 19 30; | 1 12 27; |
| mutation: | no | no | no |
| child 2' | 5 15 24 27 28; | 2 19 30; | 1 12 27; |
| child 2: | 0 10 20 29; | 1 3 27 37 |  |
| mutation: | yes in third component | no |  |
| child 2': | 0 10 17 29; | 1 3 27 37 |  |

An initial value may be given to each mutation ratio and may be set such that the value is gradually decreased for every generation to become about zero in the last generation.

Steps B5 to B7, i.e., selection, crossover, and mutation, are repeated until children are generated in the same number as that of solutions. A group of children is the set as a population of solutions of a new generation (step B8).

The processing loop constituted by the above-described generation of a population of solutions of the new generation (the loop of steps B5 to B8, executed the predetermined number of times), compaction with respect to the a population of solutions (step B2), and evaluation of the fitness (step B3) are repeated to converge on better solutions.

When the number of times the processing loop is executed reaches the number set in step A2 in FIG. 3, the flow departs from the processing loop and shifts to step B9 (step B4).

In step B9, the optimal or near-optimal solution selecting section 35 selects a solution having the maximum fitness, i.e., the minimum cost, from the solutions of this final generation, as the optimal solution, and outputs data concerning the selected solution.

Figure 6:
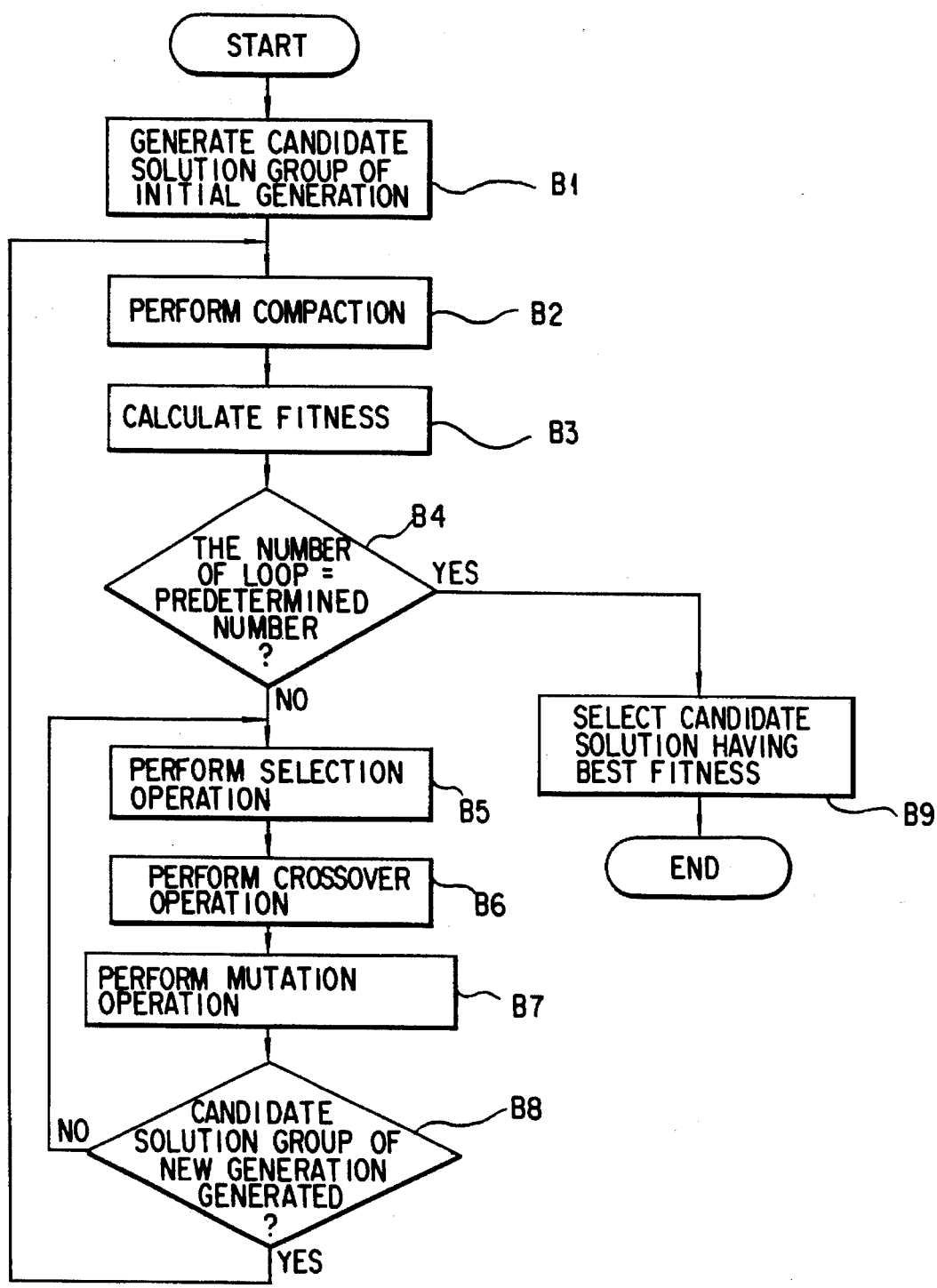
FIG. 6 is a flow chart showing the operation of an element placement means of the LSI element placement apparatus in FIG. 1 in detail.

In the above-described operation, after step B4 in FIG. 6, scaling of a fitness may be performed before control is transferred from step B8 to step B5. Scaling means that a determined fitness is enlarged or reduced by using a certain function. As scaling, linear scaling may be performed as follows:

$$f'=af+b$$

Alternatively, exponential scaling may be performed as follows:

$$f'=f^k$$

In the first embodiment, every time a partial circuit as a placement target is determined, the partial circuit data extracting unit 20 extracts data concerning all $\underline{m}$ branches included in the partial circuit, and outputs the extracted data to the element placement unit 30. However, of data concerning the branches included in a partial circuit as a current placement target, necessary data concerning (m−n) branches corresponding to the common portion between the partial circuit as the current placement target and the partial circuit as the next placement portion may be held in the element placement unit 30. In this case, the partial circuit data extracting unit 20 extracts only data concerning n branches newly added to the partial circuit as the next placement target, and outputs the extracted data to the element placement unit 30.

As described above, according to the first embodiment, since element placement is performed while the overall circuit is scanned with a partial circuit as a placement target having a common portion, placement can be performed while the overall circuit is taken into consideration in terms of continuation of local optimization. Therefore, an increase in integration density per unit element area can be realized, when an area occupied by the placed elements is used as a cost function. In addition, according to the present invention, since a placement method based on a genetic algorithm using a notation of branches is used for automatic element placement of a partial circuit as a placement target, efficient element placement can be realized.

The second embodiment of the present invention will be described below with reference to the accompanying drawings.

An apparatus arrangement and a circuit to which the apparatus is applied in the second embodiment are the same as those in the first embodiment, and hence a detailed description and corresponding drawings thereof will be omitted.

The operation procedure of the second embodiment will be described in detail below with reference to the flow charts in FIGS. 7 and 8. The same reference symbols in FIGS. 7 and 8 denote the same operations as in FIGS. 3 and 6, and a detailed description thereof will be omitted.

Data concerning a circuit diagram as a placement target, e.g., the size and type of each element, a net list, and branch information, are read from an input unit 10 (step A1).

A user operates the input unit 10 to set parameters $\underline{a}$, $\underline{b}$ and $\underline{n}$, parameters concerning an element placement unit 30 (these parameters will be described in detail later) and a height of an available placement area 60 for the elements, shown as an outer frame in FIG. 9 which shows an example of the automatic placement result of the circuit diagram in FIG. 2 which is obtained by the LSI element placement system of the present invention (step A2).

An initial a population of solutions generating section 31 generates a population of solutions of an initial generation (step B1). The following is an example of the a population of solutions generated in the second embodiment:

| | |
|---|---|
| candidate solution 1: | 0 10 24 29 37; 4 9 21; 3 3 27; |
| | 15 25 29 39; 12 20 39 41; 6 40; 9 15 23 35 |
| candidate solution 2: | 14 19 21 25 34; 5 14 26; 15 24 28; 2 3 27 |
| | 30; 1 7 12 27; 9 30; 1 3 20 20 |
| . | . |
| . | . |
| . | . |

Similar to the first embodiment, one solution has candidate values for 25 y-coordinates corresponding to the 25 elements included in the partial circuit as the placement target (In the second embodiment, the circuit shown in FIG. 2 will be explained as a partial circuit). In each sequence of numbers, the respective numbers correspond to R1, Q1, R2, Q2, R3, R4, Q3, R5, . . . in accordance with the order in which the numbers are arranged from the left to the right. In this case, in general, the number of solution of each generation $\underline{n}$ is preferably set to be 30 to 100 in terms of the effect of the present invention. In the second embodiment, assume that n=50.

An x-coordinate determination section 32 determines the x-coordinate of each element for which determination is deferred in step B1 (step B2).

The cost of each solution is evaluated by a fitness evaluating section 33 in accordance with a predetermined cost function (step C1). Several types of cost functions are defined, and evaluation is performed by using each function.

The cost is the evaluation value of each candidate solution. In the second embodiment, assume that a better solution has a smaller evaluation value. The following description will be made with reference to four types of costs, i.e., a cost concerning the adjacency of elements (to be referred as a pair cost hereinafter), a cost concerning a placement area, a cost concerning a wire length, and a cost concerning an upper and lower relationship among the elements in a predetermined branch.

A pair cost is calculated by constraints on the adjacency of elements which are input in step A2. For example, constraints on the adjacency of elements are:

1. Elements R2 and R4 should be placed to be adjacent to each other to a possible extent.
2. Elements Q8 and Q9 should be placed to be adjacent to each other to a possible extent.

In this case, an allowable placement range is set in advance with respect to two elements which are to be preferentially placed to be adjacent to each other, and, for example, the area of a portion falling outside the allowable range is regarded as a cost concerning the two elements. Costs concerning all pairs of elements which are to be preferentially placed to be adjacent to each other are calculated, and the sum of the costs is obtained as a pair cost.

A cost of a placement area is the aforementioned as the first embodiment.

A cost concerning a wire length is defined as follows. For example, a value ½ the total length of the four sides of the smallest rectangle including all terminals associated with each net is calculated. In this case, the cost concerning a wire length is defined the length of one line segment, when a minimum figure including the concerning all terminals is represented by one line segment. The sum of the values is then defined as the cost.

An order cost is used for storing the upper and lower relationship of the elements in a branch as far as possible, and for example, is defined as an aberration of a position between two adjacent elements which inequality of standard point of y-coordinates is reversed in the upper and lower direction on the same branch.

Costs calculated by these cost functions are ordered in accordance with their significance levels, and the order is used in a selection operation to be described later. Assume, in this case, that higher significance levels are set in the order of a cost (cost 1) concerning a placement area, and a cost (cost 2) concerning a wire length, and a pair and order cost (cost 3). It is assumed that significance levels of the pair cost is substantially equal to the order cost.

A selection operation is performed with respect to the a population of solutions by the selection section 36 in accordance with probabilities based on the costs of the respective solutions (step C2). This selection operation will be described below with reference to FIG. 8.

A group A including a solutions is generated with reference to cost 1 having the highest significance level, i.e., the cost concerning the placement area (step D1). In this case, a>n, and a=70.

The fitness of each solution is calculated by using cost 1. For example, a fitness $f(w)$ of a solution $w$ may be defined as follows:

$$f(w) = (\text{maximum value in cost 1 of all candidate solutions of the current generation}) - (\text{cost 1 of solution } w)$$

When the fitnesses of all $\underline{n}$ solutions are calculated, the probabilities at which the respective solutions are selected are determined on the basis of the fitnesses. For example, a selection probability P(w) of the solution w may be given by P(w)=f(w)/(sum of all fitness f)

By using the selection probability P(w) of the solution $\underline{w}$, a solutions are selected from the $\underline{n}$ solutions. In this case, since the number $\underline{a}$ of elements of the group A is larger than the number $\underline{n}$ of elements of the original a population of solutions, the group A always includes several same solutions in common.

This selection operation of the solution may be performed in the same method as the method described in the first embodiment. Thereafter, random numbers are generated $\underline{a}$ times, and a group A constituted by the corresponding $\underline{a}$ solutions is generated.

A group B constituted by $\underline{b}$ solutions is generated, from the group A constituted by the $\underline{a}$ solutions, by performing the same operation as described above using cost 2 having the second highest significance level, i.e., the cost concerning the wire length (step D2). In this case, b<a and b>n, and b=60.

By using cost 3, i.e., the pair and order costs, the same operation as described above is performed. If a plurality of costs have substantially same significant levels, each cost, for example, is changed to a real number having equal to or more than 0 and equal to or less than 1, and then the fitness is defined by considering the sum of their real numbers as cost 3. On the basis of the selection probability according to the fitness, a set C constituted by $\underline{n}$ solutions is generated, from the group B constituted by the $\underline{b}$ solutions, thus completing the selection operation (step D3). The set C including the $\underline{n}$ solutions is then used as a parent group Z for the next crossover operation.

In this case, the crossover operation has been described with reference to cost 1 to cost 3. However, if two types of costs are to be used, step D2 is omitted.

If four or more types of costs each having deferent significance are to be used, one or more steps equivalent to step D2 may be inserted, as needed. In such a case, the above-described operation is performed by using the costs in the order of significance levels. In this case, a number U(s) of solutions to be selected by using a cost s having the s-th highest significance level may be set to satisfy $U(1) > \ldots U(s-1) > U(s) > U(s+1) \ldots > n$ A plurality of cost capable of previously setting relative weight with ease may be considered as one cost. For example, the problem (placement target) such that relative weight of pair and order cost is given as 4:3 may be performed in the following manner. Each cost is changed to a real number, e.g., equal to and more than 0 and equal to or less than 1. A sum of four times of the changed pair cost and three times of the changed order cost may be considered as one cost.

A crossover section 37 performs a crossover operation of exchanging components of the $\underline{n}$ parents, i.e., solutions, included in the group Z generated by the selection operation, thus generating $\underline{n}$ children as new solutions (step B6).

First, the parents included in the group Z are combined into n/2 pairs. In this case, the parents are paired arbitrarily or randomly. These parent pairs are expressed as (parent 1, parent 2), (parent 3, parent 4), . . . , (parent n−1, parent n). In the second embodiment, since n=50, 25 parent pairs, i.e., (parent 1, parent 2), . . . , (parent 49, parent 50) are generated.

Similar to the first embodiment, a crossover operation for each parent pair is executed on the basis of a predetermined crossover ratio.

In the above-described manner, two children are generated from each parent pair, thereby generating the total children $\underline{n}$. In the second embodiment, child 1 to child 50 are generated.

A mutation section 38 performs a mutation operation with respect to the $\underline{n}$ children generated by the crossover operation, in the same manner as in the first embodiment (step B7).

It is checked whether the number of times the processing loop, constituted by a series of operations in steps B2 to B7, is repeated has reached a predetermined number of times. If NO is obtained in this decision step, the flow shifts to step B2 for compaction to repeat the processing loop. If YES is obtained in the decision step, the flow shifts to step C3 to perform an end process (step B4).

Every time the above-described processing loop is executed, a better solution is searched out to converge on the optimal or near-optimal solution.

The end process is performed (step C3). More specifically, the same operations as those in steps B2 to C2 are performed, and a solution having the smallest cost is selected, as a solution, from $\underline{n}$ solution obtained by the selection operation.

An output unit 50 outputs the contents of the placement result file to a predetermined device (step A10).

As described above, the second embodiment of the present invention uses a genetic algorithm as an optimization method, and a method of screening and selecting solutions by using cost functions in the order of significance levels when selection of solutions in each generation is performed. Therefore, the optimal or near-optimal solution can be efficiently obtained with reference to all cost functions.

Figure 9:
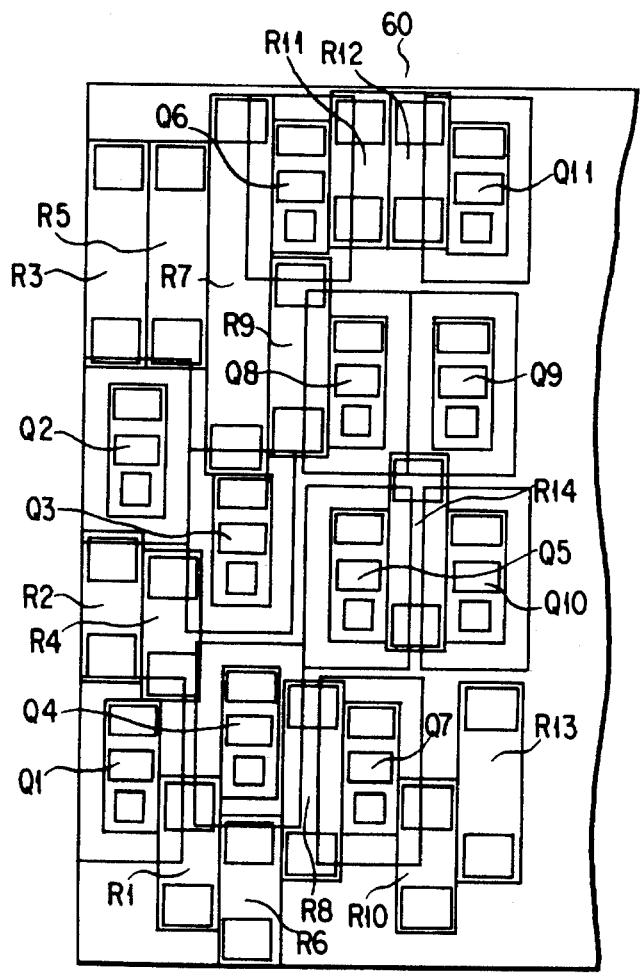
FIG. 9 is a view showing an automatic placement result corresponding to the circuit diagram in FIG. 2, which result is obtained by the LSI element placement apparatus of the present invention.

FIG. 9 shows an example of the automatic placement result of the circuit diagram in FIG. 2, obtained by using the LSI element placement system according to the present invention.

The third embodiment of the present invention will be described below with reference to the accompanying drawings.

An apparatus arrangement and a circuit to which the apparatus is applied in the third embodiment are the same as those in the first embodiment, and hence a detailed description and corresponding drawings thereof will be omitted.

Figure 10:
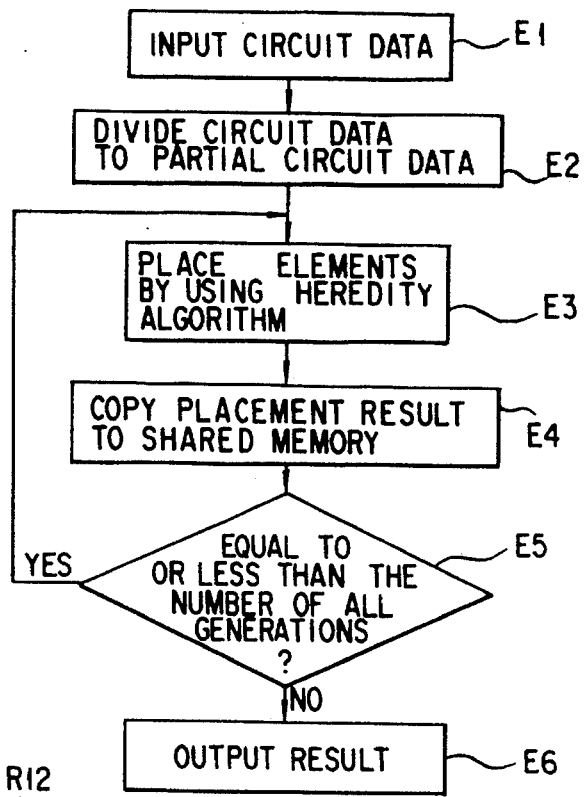
FIG. 10 is a flow chart showing a processing procedure in the third embodiment of the present invention.
Figure 12:
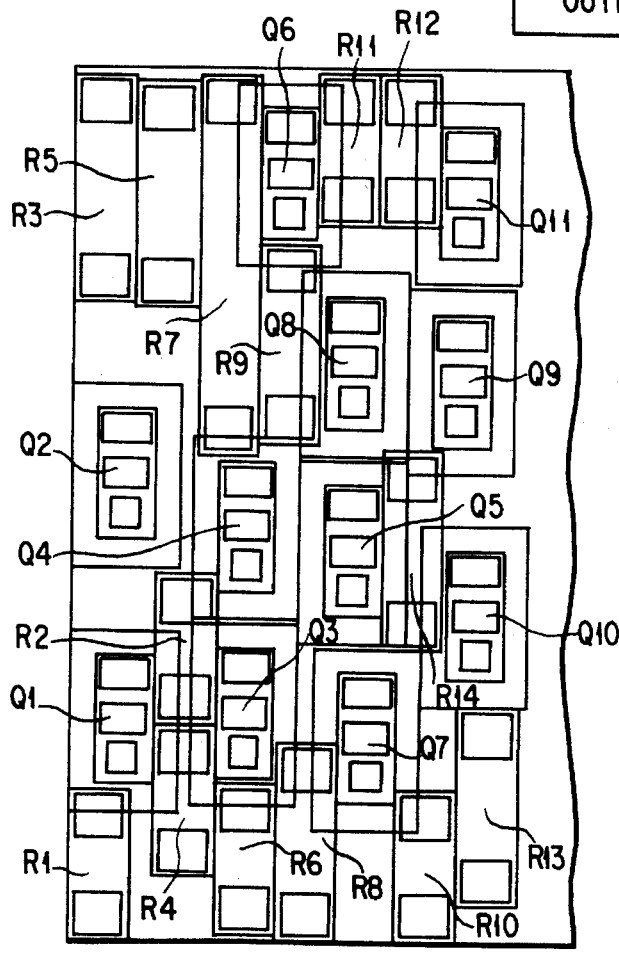
FIG. 12 is a view showing one placement result corresponding to the circuit diagram in FIG. 2, which result is obtained by using the flow chart in FIG.
Figure 11:
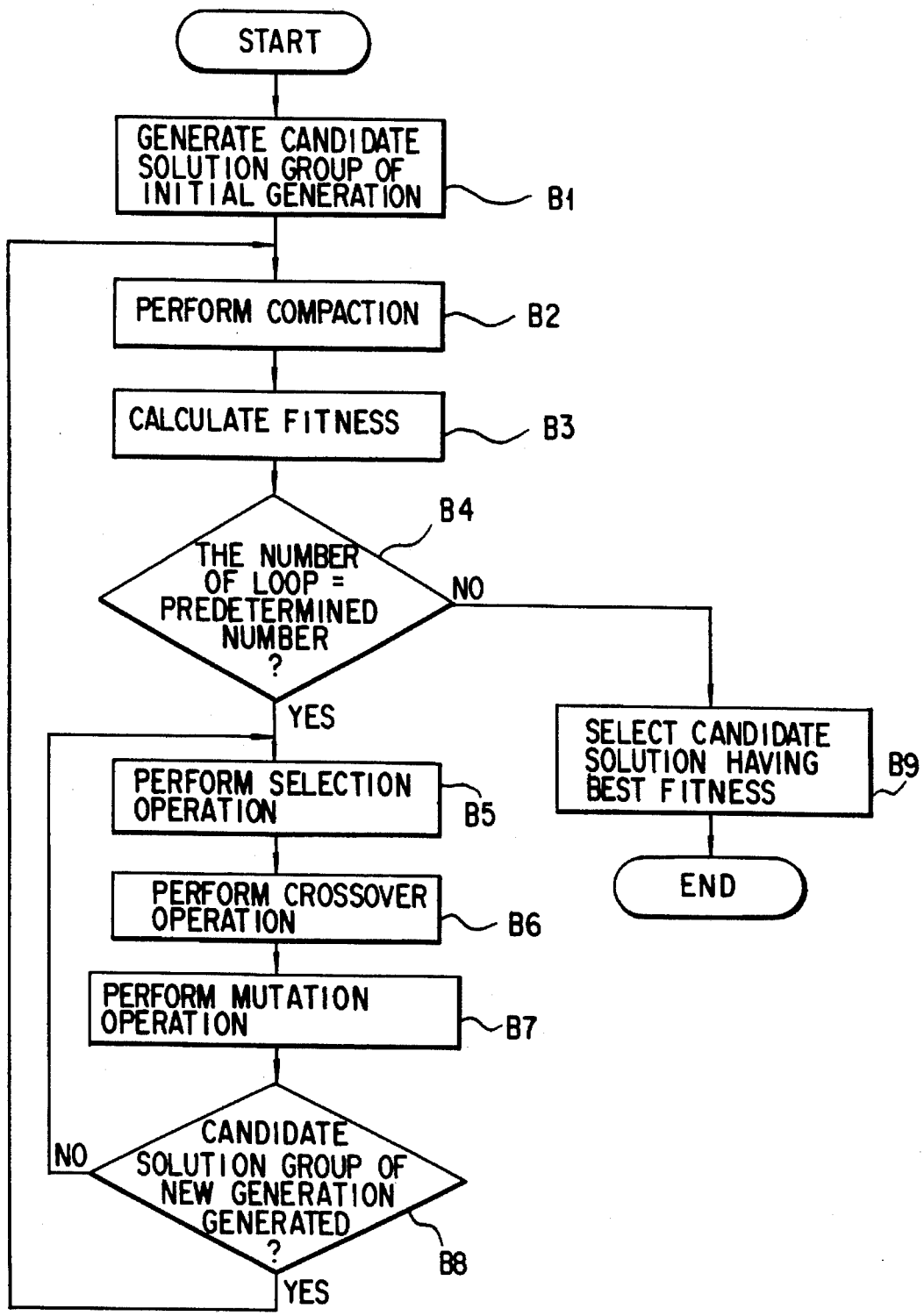
FIG. 11 is a flow chart showing an outline of a genetic algorithm in the flow chart shown in FIG. 10.

FIG. 10 is a flow chart showing an outline of the operation of the third embodiment. FIG. 11 is a flow chart showing an outline of a genetic algorithm in the flow chart shown in FIG. 10. FIG. 11 shows basically the same operation as that shown in FIG. 6. FIG. 12 shows one placement result corresponding to the circuit diagram in FIG. 2 and obtained by using the flow chart in FIG. 10.

An outline of the operation of the third embodiment will be described below with reference to FIGS. 10 and 11.

Data concerning a circuit as a placement target, e.g., the size and type of each element, a net list, and branch information, parameter concerning the element placement unit 30 and an end condition used in step E5, etc. are input (step E1). In this embodiment, the end condition is that the sum of generations of genetic algorithms with respect to arbitrary partial circuits as placement targets should be equal to or smaller than a total generation count $\underline{k}$.

The overall circuit diagram is divided into partial circuits, each constituted by a plurality of branches (step E2). In the following description, for the sake of simplicity, it is assumed that each partial circuit as a placement target is constituted by three branches. That is, the circuit shown in FIG. 2 is divided into three partial circuits as placement targets respectively constituted by three branches (R1, Q1, R2, Q2, R3), (R4, Q3, R5), and (R6, Q4, R7), three branches (R8, Q5, R9, Q6), (R10, Q7, Q8, R11), and (Q9, R12), and three branches starting from (R13, Q10, R14, Q11). For the sake of generality, assume that the circuit continues on the right side of (R13, Q10, R14, Q11) of the third partial circuit, and that the third partial circuit is also constituted by three branches. A partial circuit as a placement target on the right end of a circuit diagram may be constituted by one or two branches. However, it is not essential to describe such an exceptional case, and hence a description thereof will be omitted.

A genetic algorithm is started with respect to each of the partial circuits divided from the circuit diagram in the above-described manner to perform placement improvement in accordance with the flow chart shown in FIG. 11 (step E3). The number of genetic algorithms used in step E3 is equal to the total number (q) of partial circuits as placement targets. These genetic algorithms are simultaneously executed by using different processors. Note that each genetic algorithm is replaced with a genetic algorithm of a new generation a predetermined number j of times. Assume, in this case, that j=10.

The third embodiment is the example for referring an information of placement result of adjacent partial circuit for j=10 generations during each genetic algorithm is independently executed. It is an object of the third embodiment to consider a performance of the placement of the total circuit. That is, (i) Each genetic algorithm is executed for j=10 generations to each partial circuit (step E3).

(ii) The best placement result of the last generation (i.e., (10*i)th generation, where i=1, 2, ... ) to each partial circuit is copied to the shared memory (step E4). Here, a copy operation is an operation of overwriting new data on old data.

Repeat step E3 and step E4 until the last generation number is equal to the total generation count $\underline{k}$ (step E5). That is, at step E5, it is checked whether the last generation number is equal to or smaller than $\underline{k}$. If YES is obtained in this decision step, the flow returns to step E3. Otherwise, the flow advances to step E6. Assume, in this case, that k=j× 100= 10×100=1,000. That is, the loop constituted by steps E3 to E5 is repeated a total of 100 times.

If a genetic algorithm in step E3 is executed as processing to be continued to step E5, the genetic algorithm used for the i-th ($2 \leq i \leq q$) partial circuit refers to the information about the placement result which is obtained with respect to the (i−1)th partial circuit and copied to the shared memory.

If the decision in the step E5 is NO, the best solution to each partial circuit at this time, i.e., the information about the placement result obtained with respect to each partial circuit and copied last by the shared memory is output (step E6). With this operation, the final placement coordinates of all the elements of the circuit are determined.

Each genetic algorithm in step E3 will be described below with reference to the flow chart shown in FIG. 11. A detailed description of the same operation of the third embodiment as that of the first embodiment will be omitted.

The third embodiment is characterized in that the number of genetic algorithms used in step E3 is equal to the total number q of partial circuits as placement targets determined in step E2, and the genetic algorithms are simultaneously executed in accordance with the flow chart shown in FIG. 11.

Similar to the first embodiment, a population of solutions of an initial generation is generated, which is constituted by a plurality of solutions expressed by the y-coordinates of the respective elements of each branch belonging to a partial circuit as a placement target, which are arranged in accordance with the order in which the elements are arranged (step B1).

The generation of the initial generation in the step B1 is necessary only in the case that the processing of step E3 is applied at first, and is not used in the second or subsequent processing loop of steps E3 to E5.

Compaction is performed in the same manner as in the first embodiment to determine x-coordinates with respect to each solution (step B2). In this case, in the third embodiment, a condition that elements must be placed inside the left edge of the placement area as shown in FIG. 12 is added to compaction with respect to a branch belonging to the first partial circuit. In performing compaction with respect to the branch of the second or subsequent partial circuit, the same condition as that for the first partial circuit is added when the processing in step E3 is applied for the first time. When the processing in step E3 is to be applied after the processing in step E5, elements are compressed by compaction with respect to the placement result corresponding to the partial circuit, which is left partial circuit copied to the shared memory, i.e., the (i−1)th partial circuit.

Similar to the first or second embodiment, the fitness of each solution is calculated in accordance with a fitness function defined by a predetermined cost function (step B3). In the third embodiment, a cost is defined as follows. Costs, e.g., a cost concerning a wire length, a cost concerning a placement area, an order cost and a pair cost added to make the right end of a placement result become closer to a straight line, are respectively weighted. The sum of the costs is then used as the cost of a solution.

The smaller a cost is, the better the solution is. Therefore, for example, a fitness f(w) of a solution $\underline{w}$ is defined as follows:

$$f(w)=\text{(maximum value of costs of all solutions of current generation)}-\text{(cost of solution } \underline{w})$$

When a cost with respect to the i-th ($i \geq 2$) partial circuit is to be calculated, a cost based on the connection relationship between the i-th and (i−1)th partial circuits is also taken into consideration. For example, the length of a net connecting the i-th partial circuit to the (i−1)th partial circuit is also added to the wire length. As the information about the placement result corresponding to the (i−1)th partial circuit, the information copied to the shared memory is used.

Subsequently, steps B5 to B8 are repeated to generate a new a population of solutions.

Two solutions to be subjected to a crossover operation are selected from all the solutions in accordance with selection probabilities determined on the basis of the fitnesses calculated in step B3 (step B5).

A crossover operation is performed with respect to parent 1 and parent 2 selected in step B5 on the basis of the predetermined crossover rate to generate two children. These children are defined as child 1 and child 2 (step B6).

Steps B5 to B7, i.e., selection, a crossover, and mutation, repeated until children equal in number to the solutions are generated (step B8). A group of children is defined as a population of solutions of a new generation.

A mutation operation is performed with respect to child 1 and child 2 selected in step B6 on the basis of the predetermined mutation rate (step B7).

By replacing the steps B3 and B5 to the steps C1 and C2, a decision operation in step B4 may execute after selection operation.

The above-described processing loop (generation) constituted by the generation of a population of solutions of a new generation and compaction and evaluation of fitnesses with respect to this a population of solutions is repeated $j$ times to converge to better solution. When the sum of generations with respect to the i-th partial circuit as the current placement target, i.e., the total number of times the processing loop has been performed since the process of step E3 was applied to the i-th partial circuit for the first time, reaches a multiple of the above-mentioned designated number j, i.e., one of j, 2 j, 3 j, . . . , 100 j, the flow departs from the processing loop and shifts to step B9. In step B4, determination for this operation is performed.

In step B9, a solution having the maximum fitness of last generation, i.e., the minimum cost, is selected, as the best solution, from all the solutions obtained by the processing loop executed $j$ times, and data concerning the selected solution is output.

The above-described genetic algorithms in step E3 are executed simultaneously with respect to all partial 10 circuits as placement targets.

As described above, according to the third embodiment, an overall circuit is divided into partial circuits as placement targets, each constituted by a plurality of branches. Heredity algorithms are simultaneously applied to element placement of the respective partial circuits in consideration of the relative relationship between adjacent partial circuits by applying a genetic algorithm to element placement of a given partial circuit upon referring to information about a placement result which corresponds to a partial circuit immediately preceding the given partial circuit and is obtained from the best solution determined every generation count $j$ designated in advance. Therefore, a high-quality placement result can be obtained at a high speed in consideration of the overall circuit.

The fourth embodiment of the present invention will be described below with reference to the accompanying drawings.

An apparatus arrangement and a circuit to which the apparatus is applied in the fourth embodiment are the same as those in the first embodiment, and hence a detailed description and corresponding drawings thereof will be omitted.

Figure 13:
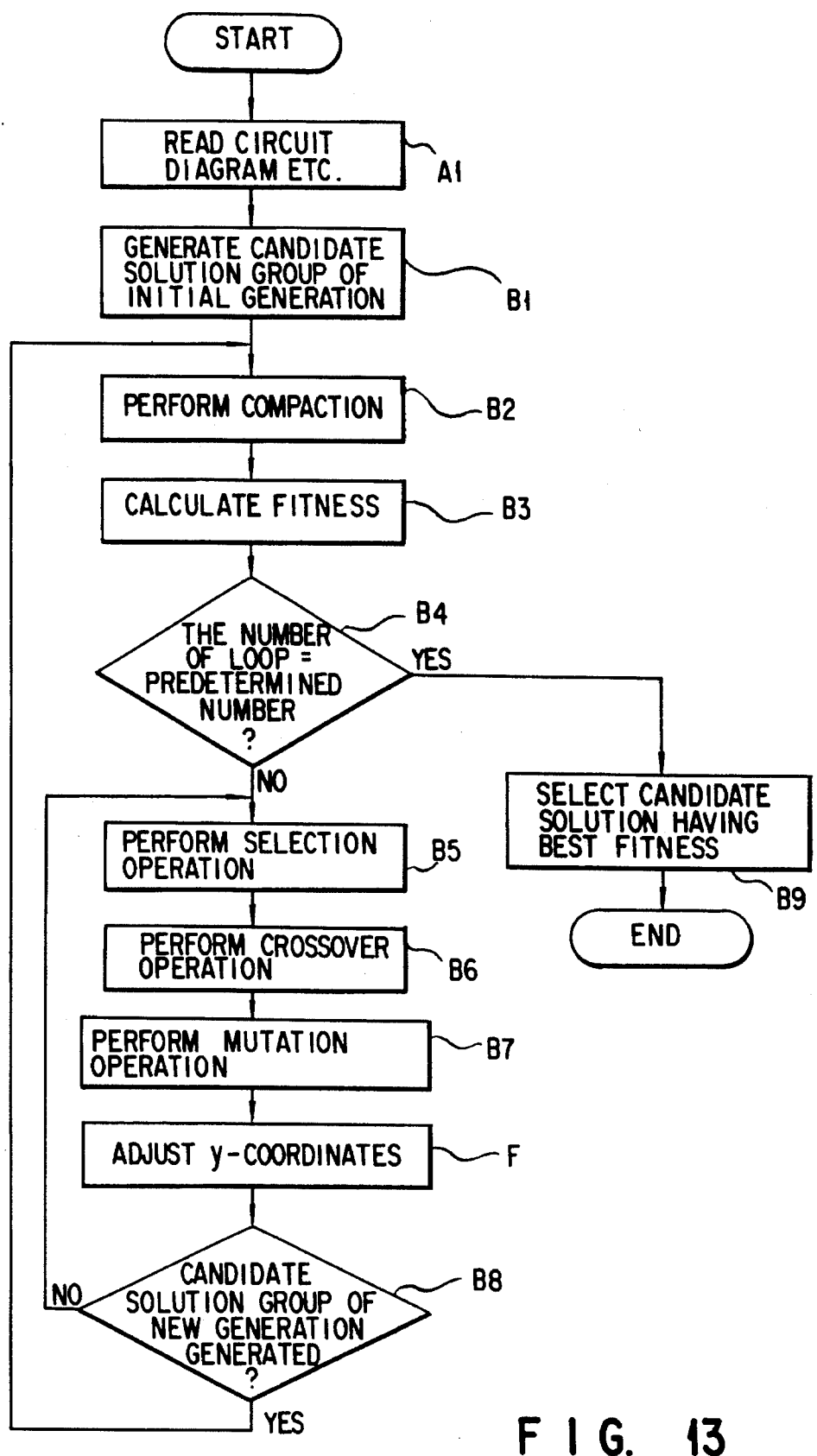
FIG. 13 is a flow chart showing a processing procedure in the fourth embodiment of the preset invention.
Figure 14:
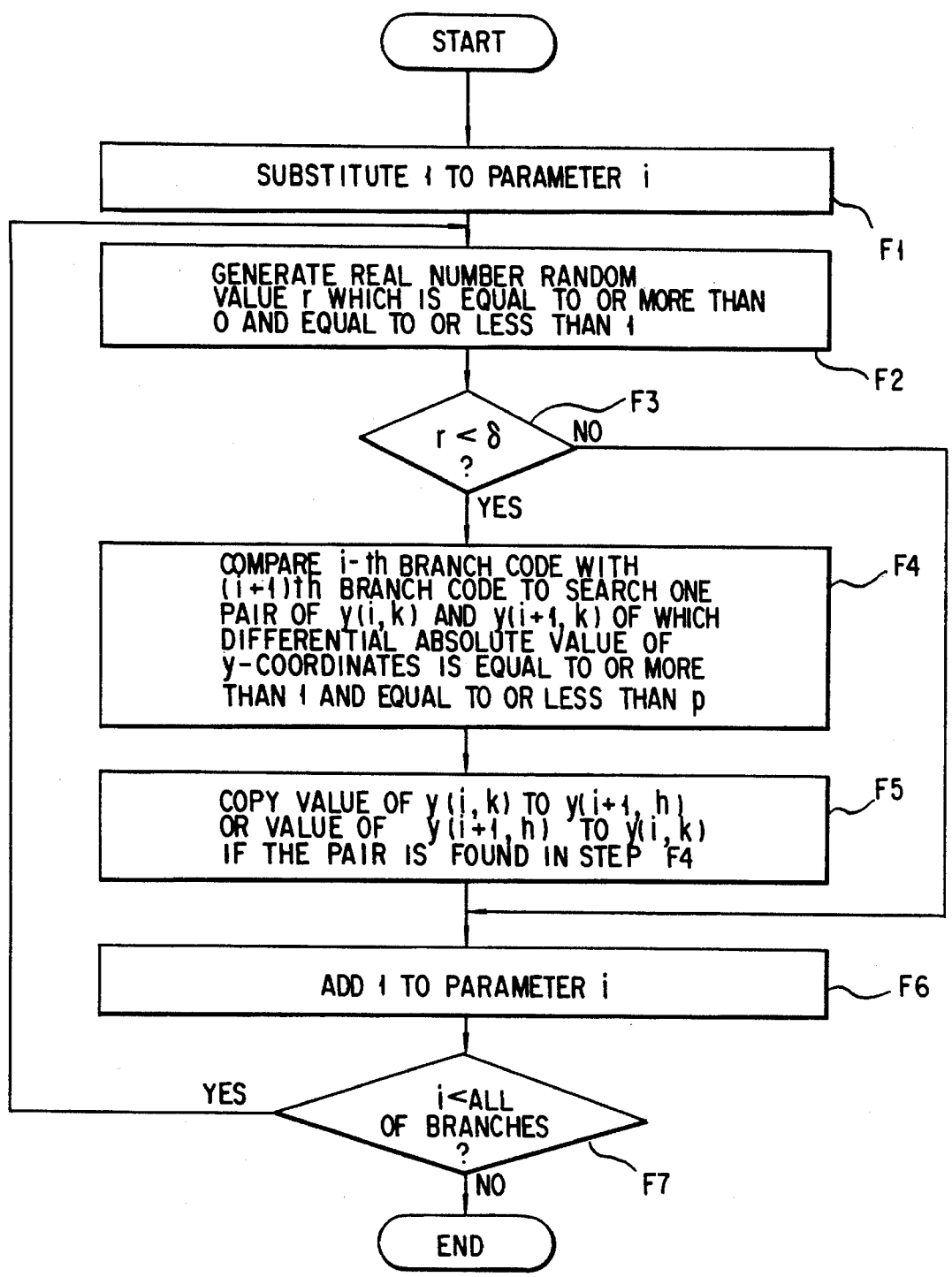
FIG. 14 is a flow chart showing an outline of y-coordinate adjustment in the flow chart in FIG. 13.
Figure 15:
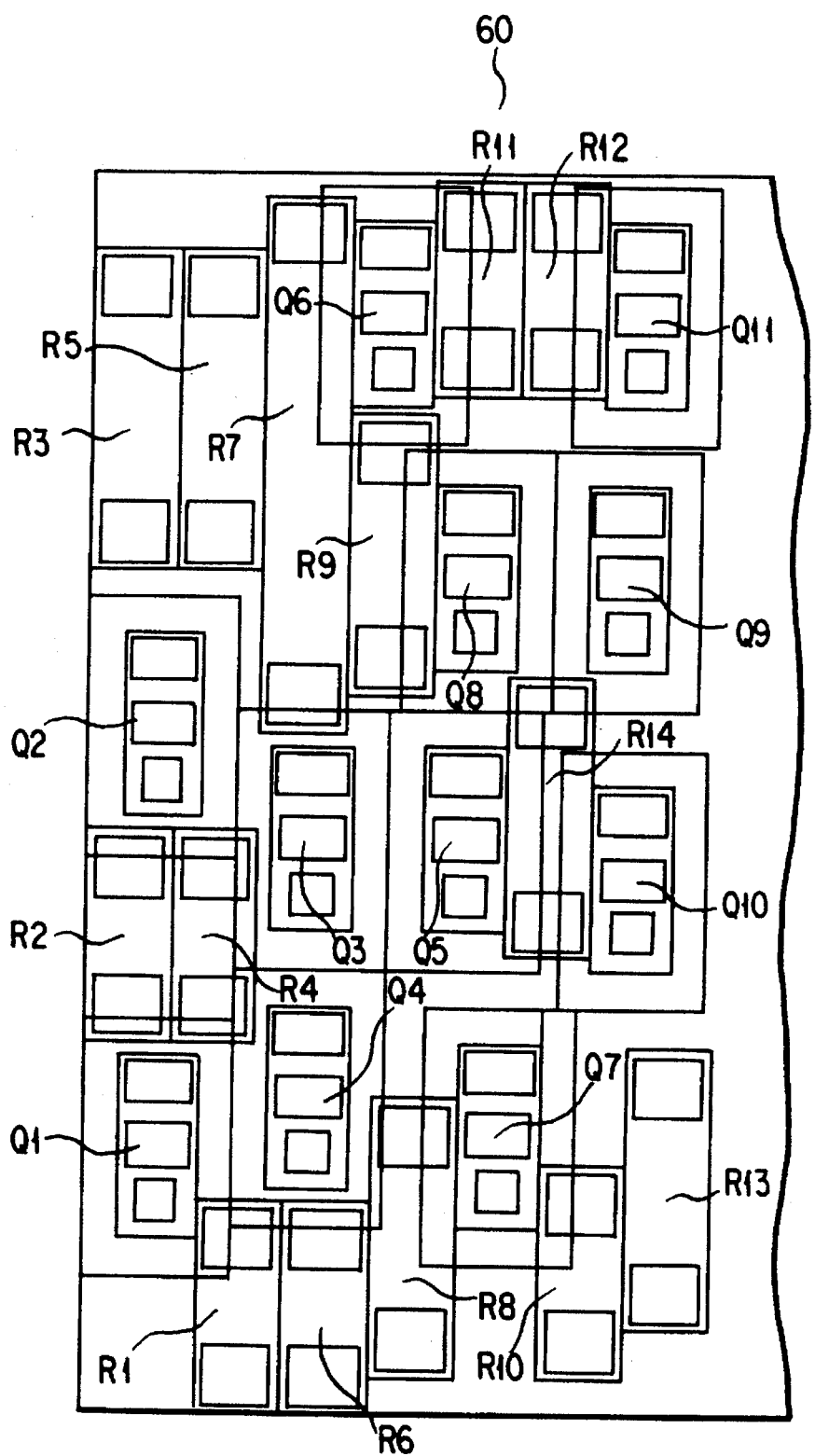
FIG. 15 is a view showing one placement result corresponding to the circuit diagram in FIG. 2, which result is obtained by using the flow chart in FIG. 13.

FIG. 13 is a flow chart showing the operation of the fourth embodiment of the present invention. The flow chart in FIG. 14 shows an outline of adjustment of y-coordinates in the flow chart in FIG. 13. FIG. 15 shows one placement result corresponding to the circuit diagram in FIG. 2 and obtained in accordance with the flow chart in FIG. 13.

The operation of the fourth embodiment will be described below with reference to FIGS. 13 and 14. The same reference symbols in FIG. 13 denote the same operations in FIGS. 3 and 6, and a detailed description thereof will be omitted.

Similar to the first embodiment, data concerning a circuit diagram (e.g., the size and type of each element, a net list, and branch information), parameters concerning the element placement unit 30 and parameters used in step F, etc., are read through an input unit 10 (step A1).

In the same manner as in the first embodiment, a population of solutions of initial generation including a plurality of solutions presented by arranging y-coordinates according to an order of the elements for each branch belonging to the circuit diagram of the placement target.

Similar to the first embodiment, compaction is performed with respect to each solution to determine x-coordinates (step B2).

The fitness of each solution is calculated in accordance with the fitness function defined by a predetermined cost function in the same manner as in the first embodiment (step B3). The fourth embodiment uses cost functions similar to those used in the first to third embodiments.

Subsequently, steps B5 to B8 are repeated to generate a new a population of solutions. Since steps B5 to B8 are the same as those in the first embodiment (except for step F), a detailed description thereof will be omitted.

Two solutions (parent 1 and parent 2) to be subjected to a crossover operation are selected from all the solutions in accordance with selection probabilities determined on the basis of fitnesses calculated in step B3 (step B5).

A crossover operation is performed with respect to parent 1 and parent 2 selected in step B5 on the basis of the predetermined crossover rate to generate child 1 and child 2 (step B6).

Mutation is performed with respect to child 1 and child 2 generated in step B6 mutation ratios designated beforehand, thus generating child 1' and child 2' (step B7).

A search operation is performed to find a pair of elements, in a branch adjacent to the branch to which child 1' and child 2' belong, which have y-coordinates close to the y-coordinates of child 1' and child 2', in accordance with a probability $\delta$ designated in advance. If such a pair is found, the y-coordinates of these pairs are set to be equal to each other (y-coordinate adjustment is performed) (step F).

Steps B5 to step F, i.e., selection, a crossover, mutation, and y-coordinate adjustment, are repeated until children equal in number to the solutions are generated (step B8). A group of children is defined as a population of solutions of a new generation.

The above-described processing loop (generation) constituted by the generation of a population of solutions of a new generation, compaction with respect to this a population of solutions, and the calculation of fitnesses is repeated the number of times corresponding to a predetermined number of generations to converge on a better solution. In this case, in addition to the condition that "if the number of times of execution of the processing loop reaches the predetermined number of generations", a condition that "if all elements have the same fitness" may be added as a condition that allows the flow to depart from the processing loop.

Information about a placement result obtained from the best solution in the last generation, i.e., the placement coordinates of each element, are output (step B9).

Adjustment of y-coordinates in step F will be described in detail below with reference to FIG. 14.

The value of a parameter $i$ used as the number of times of execution of the loop is set to 1 (step F1).

A uniform real number random value r which is equal to or larger than 0 and equal to or smaller than 1 is generated (step F2).

If the value $r$ is smaller than the probability $\delta$ associated with y-coordinate adjustment, the flow advances to step F4. Otherwise, the flow advances to step F6 (step F3). In this case, for example, if r=0.4 and $\delta$=0.7, the flow advances to step F4. The value of $\delta$ may be set as a constant throughout the generations of genetic algorithms, or may be dynamically changed, e.g., gradually increased, with the progress of generation. If this value is increased, the degree of alignment in the x direction generally increases with the alternation of generations.

The codes of the i-th and (i+1)th branches are compared with each other to find one pair y(i,k) and y(i+1,h) between which the absolute value of the difference in y-coordinate is equal to or larger than 1 and equal to or smaller than p. If a plurality of such pairs are found, one pair is selected at random (step F4).

In this case, y(j,m) is a symbol indicating the mth element of the jth branch. The value of p reflects the degree of closeness of y-coordinates. Assume, in this embodiment, that p=2. That is, if $$|y(i,k)-y(i+1,h)|=1 \text{ or } 2$$

then, it is determined that the kth element of the ith branch is close to the hth element of the (i+1)th branch.

Assume that when i=1, the code of the first branch in child 1' is 0 10 15 27 37 and the code of the second branch is 0 26 30

In this case, when the code of the first and second branches are compared with other, since $|y(1,4)-y(2,2)|=|27-26|=1$, it can be considered that the fourth element of the first branch is close to the second element of the second branch.

The above-mentioned adjacent pair of y(i,k) and y(i+1,h) may be found by the following method. For example, an element y(i,a) of the ith branch and an element y(i+1,b) of the (i+1)th branch are randomly selected. The above-mentioned condition is then checked. That is, it is checked whether the absolute value of the difference between these two elements is equal to or larger than 1 and equal to or smaller than p. Such an operation is repeated about 10 times at most. If at least one pair satisfies the condition in the process of the operation, the pair is used as an adjacent pair. Alternatively, all possible pairs may be checked to select one pair which satisfies the condition. This method, however, requires a longer check time.

If a pair of adjacent elements y(i,k) and y(i+1,h) are searched out in step F4, one of the values is copied (overwritten) to the other (step F5). That is, (a) the value of y(i,k) is copied to y(i+1,k), or (b) the value of y(i+1,h) is copied to y(i,k).

Whether (a) or (b) is executed is randomly determined. If, for example, (a) is executed with respect to a pair of y(1,4) and y(2,2) used in the description of step F4, the code of the second branch in child 1' is represented by 0 27 30

As a result, the fourth element of the first branch and the second element of the second branch are set to be adjacent to each other in the lateral direction from the point of view that the reference points of the two elements are located on the same horizontal line (y=27).

Assume that the y-coordinates of two elements which have undergone y-coordinate adjustment in the above-described manner are not changed again until the flow departs from the loop constituted by steps F2 to F7. If, therefore, a change of the value of y(i,k) is not allowed, as in an exceptional case of the above-described selection of (a) and (b), (a) is selected.

As described above, the y-coordinates of two elements which have undergone y-coordinate adjustment once are not changed again while the value i is smaller than the total number of branches. For this reason, if the codes of adjacent branches are 0 25 40; 0 26 36; 5 26 the following inefficient operation can be avoided. That is, the second value of the second branch is temporarily adjusted to 25 when "i=1", and is restored to 26 when "i=2".

For example, the codes of the branches change as follows:

0 25 40; 0 26 36; 5 26 (i=1; (a) is executed)

0 25 40; 0 25 36; 5 26 (i=2; (b) is executed)

0 25 40; 0 26 36; 5 26

If no adjacent pair is searched out in step F4, no processing is executed in step F5.

"1" is added to the parameter i (step F6).

Subsequently, steps F2 to F6 are repeated the number of times corresponding to (the total number of branches-1) (step F7). In the case shown in FIG. 2, these steps are repeated 7-1=6 times.

In the method shown in FIG. 14, the parameter i is increased, one by one, from the initial value 1 to sequentially perform y-coordinate adjustment with respect to the elements of a branch, from the left side. In contrast to this, the initial value of the parameter i may be set to (the total number of branches-1) and sequentially decreased one by one to sequentially perform y-coordinate adjustment with respect to the elements of a branch, starting the rightmost element. Alternatively, (the total number of branches×δ) values which are equal to or larger than 1 and equal to or smaller than (the total number of branches-1) may be randomly selected as values of the parameter i, and the operations in steps F4 and F5 may be performed.

As described above, according to the fourth embodiment, in using genetic algorithms based on the characteristics of branches, y-coordinate adjustment is performed as one of heredity operations so that element pairs which are adjacent to each other to facilitate reduction in area and wiring can be gradually aligned in the x direction. Therefore, finally, a high-quality placement result having good alignment characteristics in the x direction can be efficiently obtained.

The present invention is not limited to the above-described embodiments.

In the embodiments, placement of elements is sequentially performed from the elements belonging to the leftmost branch. It is, however, apparent that the present invention can be applied to a case wherein elements are sequentially placed from the rightmost branch. In this case, the same effects as those described above can be obtained.

Figure 7:
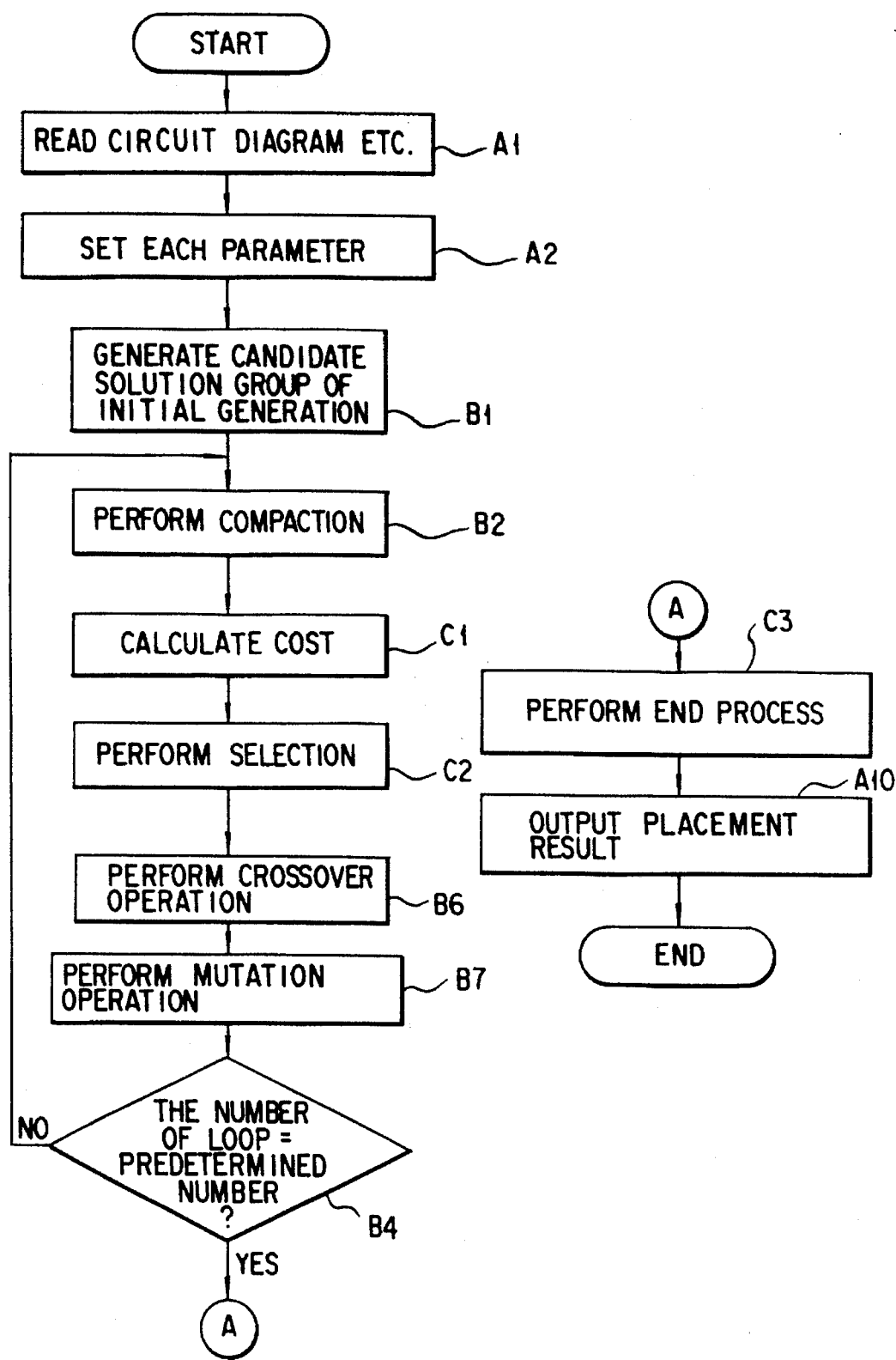
FIG. 7 is a flow chart showing the operation of an LSI element placement apparatus according to the second embodiment of the present invention.
Figure 8:
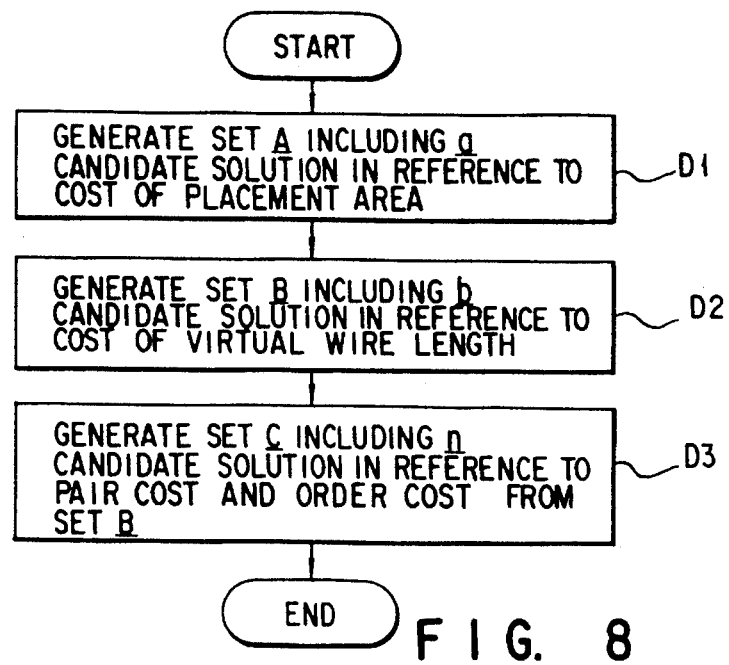
FIG. 8 is a flow chart showing the operation of a selection means in the second embodiment.

Referring to FIG. 7, the decision operation in step B4 may be set between the selection operation in step C2 and the crossover operation in step B6. In addition, the end process in step C3 may be replaced with selection processing of the best solution, and the number of times in the decision operation in step B4 may be incremented by one. Even with this setting, the resultant flow chart is equivalent to that shown in FIG. 7.

The method of the genetic algorithms used in FIGS. 6, 7, 11 and 13 are basic algorithms, and other various genetic algorithms can be used. As is apparent, for example, the present invention may include various methods such as an elite strategy of unconditionally leaving the best solution in a previous generation to the next generation, or a scaling technique and expectation strategy for preventing convergence on a local solution in the initial generation. In the first to fourth embodiments, when a new generation is to be generated, children equal in number (e.g., 50) to parents are generated, and a group of children generated in this manner is defined as a population of solutions of a new generation. Instead of using this method, the following method can be used. For example, 20 children are generated, and 50 elements are selected from a group of 70 solutions, obtained by adding the children to a group of parents, in the order of fitness. The selected elements are then defined as a population of solutions of a new generation.

The present invention is not limited to the above-described embodiments. Various modifications and changes can be made without departing from the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An LSI element placement method of placing elements in accordance with an order in which branches are arranged, each branch being constituted by an element array included in a circuit diagram having first and second terminals, said method comprising the steps of:

a partial circuit extraction step of sequentially extracting data of a predetermined number of branches included in the circuit diagram from the first terminal side of the circuit diagram so as to overlap the data by a predetermined number; and an element placement step of performing an element placement operation based on a genetic algorithm in the extracted partial circuit data and said overlapping data, thereby generating an element placement result including placement coordinate data of all elements included in the partial circuit data.

2. A method according to claim 1, further comprising a file generation step of generating a placement result file on the basis of the element placement result.

3. A method according to claim 2, further comprising a set step of presetting a predetermined first positive integer m and a second positive integer n smaller than the first positive integer m, wherein said partial circuit extraction step includes a step of, when the branch data are to be extracted for the first time, continuously extracting m branch data from the first terminal to the second terminal of the circuit diagram, a step of, when the branch data are to be extracted for the second and subsequent times, continuously extracting m branch data including branch data extracted in an immediately preceding extraction step except for n branch data from the first terminal, and a step of extracting all data when the number of branch data is less than m in a last extraction step, and said file generation stop includes a step of recording an element placement result associated with elements included in n continuous branch data located closest to the first terminal, of branch data included in the element placement result generated by the element placement step, and a step of recording an element placement result associated with all elements included in a last element placement result generated by the element placement step.

4. A method according to claim 2, further comprising a set step of presetting a predetermined first positive integer m and a second positive integer n smaller than the first positive integer m, wherein said partial circuit extraction step includes a step of, when the branch data are to be extracted for the first time continuously extracting m branch data from the first terminal to the second terminal of the circuit diagram, a step of, when the branch data are to be extracted for the second and subsequent times, extracting n branch data from the first terminal side of branch data extracted in an immediately preceding extraction step, a step of extracting all data when the number of branch data is less than n in a last extraction operation, and said file generation step includes a step of recording an element placement result associated with elements included in n continuous branch data located closest to the first terminal, of branch data included in the element placement result generated by the element placement step, and a step of recording an element placement result associated with all elements included in a last element placement result generated by the element placement step.

5. A method according to any one of claims 1–4, wherein said element placement step includes a population of initial solutions generation step of using the branch data extracted in the extraction step and said overlapping data to generate a population of solutions including a plurality of solutions constituted by candidate values for predetermined first coordinates of all elements included in the branch data, a second coordinate determination step of determining second coordinates perpendicular to the first coordinates of all elements associated with the population of solutions in units of solutions by using a compaction method, a fitness evaluation step of evaluating a fitness of each solution for which the second coordinate has been determined, a population of new solutions generation step of generating a population of new solutions by performing predetermined processing on the basis of the evaluation of each fitness, a step of repeating the second coordinate determination step to a population of new solutions step a predetermined number of times, and an optimal solution selection step of evaluating fitness with respect to a population of new solutions, selecting a solution having the best fitness from the population of solutions, and outputting an element placement result associated with said branches extracted in said partial circuit extracting step and said overlapping data.

6. A method according to claim 5, wherein said population of new solutions generation step includes
      a selection step of selecting two solutions on the basis of the evaluated fitness of the population of solutions,
      a crossover step of exchanging a predetermined number of components between the two selected solutions, and
      a mutation step of performing a predetermined arithmetic operation with respect to a predetermined number of components of the solutions for which the exchange has been performed.

7. A method according to claim 5, wherein the population of initial solutions generation step includes the step of generating a population of solutions by receiving and inheriting values of the first coordinates of elements associated with the partial circuit data, without any modification, which elements are common to elements in the partial circuit data used for an immediately preceding element placement operation, of the partial circuit data extracted in the partial circuit extraction step.

8. A method according to any one of claims 1–4, wherein said element placement step includes
- a population of solutions generation step of using the branch data extracted in said partial circuit extraction step and said overlapping data to generate a population of solutions including a plurality of solutions constituted by candidate values for predetermined first coordinates of all elements included in the branch data,
- a second coordinate determination step of determining second coordinates perpendicular to the first coordinates of all elements associated with the population of solutions in units of solutions by a compaction operation,
- a search step of searching a pair of elements for each solution of the population of solutions, of elements included in the adjacent branches, which have the first coordinates which are close to each other, in accordance with a predetermined probability, and
- an adjustment step of, when a pair of elements which are close to each other are found, adjusting first coordinate values of the elements to be equal to each other.

9. A method according to claim 8, wherein said adjustment step includes a step of holding the values of the adjusted first coordinates until adjustment of first coordinates is performed with respect to a population of new solutions.

10. A method according to claim 6, wherein said element placement step includes a step of setting a sequence of numbers, as the solutions, obtained by arranging and coding candidate values for first coordinates corresponding to each element included in the partial circuit as the placement target in accordance with an order in which branches are arranged from the first terminal and an order in which elements in each branch are arranged, said selection step includes a step of selecting two solutions in accordance with probabilities determined on the basis of fitness associated with the solutions in units of solutions, said crossover step includes a step of performing exchange of the components in accordance with crossover ratios determined on the basis of an order in which branches are newly added to the partial circuit as the placement target in the extraction step in units of branches, and said mutation step includes a step of performing the predetermined arithmetic operation in accordance with mutation ratios determined on the basis of the order in units of branches.

11. A method according to claim 1, wherein said element placement stop includes a selection step of selecting a predetermined number of solutions of the next population from the present population consisting of the predetermined number of solutions, said selection step including
- an evaluation step of evaluating a plurality of costs including at least a first cost associated with an element placement area in units of the first solutions and a second cost associated with a positional relationship between elements,
- a first generation step of calculating a selection probability of each of the first solutions by using a predetermined function on the basis of the first cost to select a plurality of second solutions larger in number than a predetermined number from a population of first solutions, and generating a population of second solutions including the second solutions,
- a second generation step of calculating a selection probability of each of the second solutions by using a predetermined function on the basis of the second cost to select a plurality of third solutions larger in number than the first solutions and smaller in number than the second solutions from the population of second solutions, and generating a population of third solutions including the third solutions, and
- a third generation step of repeating the second generation step until a population of final solutions are generated with reference to all costs.

12. A method according to claim 11, wherein said element placement step includes a second coordinate determination step of determining second coordinates of all elements associated with the population of first solutions in units of the first solutions prior to execution of the evaluation step, a crossover step of selectively forming solution pairs equal to half the number of solutions included in the population of last solutions after execution of the third generation step, and exchanging components between solutions constituting each of the solution pairs, a mutation step of performing a predetermined arithmetic operation with respect to a predetermined component of each of the solutions which have undergone the exchange to generate a population of new solutions, and a step of repeating said second coordinate determination step to said mutation step, a predetermined number of times, with respect to a population of new solutions generated in the mutation step.

13. A method according to any one of claim 11 or claim 12, wherein said evaluation step includes a step of evaluating a cost associated with adjacency of elements, a cost associated with an element area, and a cost associated with a wire length.

14. A method according to claim 8 or 12, wherein said second coordinate determination step includes a step of determining a second coordinate of each element associated with the solution by a compaction operation.

15. An LSI element placement method of placing elements in accordance with an order in which branches are arranged, each branch being constituted by an element array included in a circuit diagram having first and second terminals, comprising:
- a division step of dividing the circuit diagram into a plurality of partial circuits, each constituted by a plurality of branches; and
- a parallel processing step of simultaneously applying genetic algorithms to element placement of the respective partial circuits, wherein said parallel processing step includes a step of obtaining fitness used for the genetic algorithms with respect to the respective partial circuits with reference to information about a connection relationship between elements of each partial circuit as a placement target, and information about a placement result based on a best solution every predetermined number of generations of the immediately left partial circuit as a placement target.

16. A method according to claim 15, wherein said parallel processing step includes a step of arranging and coding first coordinates by using a genetic algorithm applied to each of the partial circuits as the placement targets, in units of branches, in accordance with an order in which elements are arranged, and a step of determining a second coordinate of each element which is perpendicular to the first coordinate by performing a compaction operation with respect to a placement result based on a best solution determined every predetermined number of generations of an immediately preceding partial circuit as a placement target.

17. An LSI element placement apparatus for placing elements in accordance with an order in which branches are arranged, each branch being constituted by an element array included in a circuit diagram having first and second terminals, said apparatus comprising:

partial circuit data extraction means for sequentially extracting data of a predetermined number of branches included in the circuit diagram from a first terminal side of the circuit diagram so as to overlap the data by a predetermined number; and element placement means for performing an element placement operation based on a genetic algorithm in the partial circuit data extracted by said partial circuit data extraction means and said overlapping data, thereby generating an element placement result including placement coordinate data of all elements included in the partial circuit data.

18. An apparatus according to claim 17, further comprising placement result file generation means for generating a placement result file on the basis of the element placement result obtained by said element placement means.

19. An apparatus according to claim 18, further comprising set means for presetting a predetermined first positive integer $\underline{m}$ and a second positive integer $\underline{n}$ smaller than the first positive integer, wherein said partial circuit data extraction means includes means for, when the branch data are to be extracted for the first time, continuously extracting $\underline{m}$ branch data from the first terminal to the second terminal of the circuit diagram, means for, when the branch data are to be extracted for the second and subsequent times, continuously extracting $\underline{m}$ branch data including branch data extracted in an immediately preceding extraction operation except for $\underline{n}$ branch data from the first terminal, and means for extracting all data when the number of branch data is less than $\underline{m}$ in a last extraction operation, and said placement result file generation means includes means for recording only an element placement result associated with elements included in $\underline{n}$ continuous branch data located closest to the first terminal, of branch data included in the element placement result generated by said element placement means, and means for recording an element placement result associated with all elements included in a last element placement result generated by said element placement means.

20. An apparatus according to claim 18, further comprising set means for presetting a predetermined first positive integer $\underline{m}$ and a second positive integer $\underline{n}$ smaller than the first positive integer, wherein said partial circuit data extraction means includes means for, when the branch data are to be extracted for the first time, continuously extracting $\underline{m}$ branch data from the first terminal to the second terminal of the circuit diagram, means for, when the branch data are to be extracted for the second and subsequent times, extracting n branch data from the first terminal side of branch data extracted in an immediately preceding extraction operation, means for extracting all data when the number of branch data is less than $\underline{n}$ in a last extraction operation, and said placement result file generation means includes means for recording only an element placement result associated with elements included in $\underline{n}$ continuous branch data located closest to the first terminal, of branch data included in the element placement result generated by said element placement means, and means for recording an element placement result associated with all elements included in a last element placement result generated by said element placement means.

21. An apparatus according to any one of claims 17–20, wherein said element placement means includes a population of initial solutions generation means for using the branch data extracted by said partial circuit data extraction means and said overlapping data to generate a population of solutions including a plurality of solutions constituted by candidate values for predetermined first coordinates of all elements included in the branch data, second coordinate determination means for determining second coordinates perpendicular to the first coordinates of all elements associated with the population of solutions in units of solutions, fitness evaluation means for evaluating a fitness of each solution for which the second coordinate has been determined, and near-optimal solution selection means for selecting a solution having the best fitness from a population of solutions, and outputting an element placement result associated with branches included in the circuit diagram.

22. An apparatus according to claim 21, wherein said population of new solutions generation means includes selection means for selecting two solutions on the basis of the evaluated fitnesses of the population of solutions, crossover means for exchanging a predetermined number of components between the two selected solutions, and mutation means for performing a predetermined arithmetic operation with respect to a predetermined number of components of the solutions for which the exchange has been performed.

23. An apparatus according to claim 21, wherein said population of initial solutions generation means includes means for generating a population of solutions by receiving and succeeding a value of the first coordinate of an element associated with branch data, without any modification, which element is common to an element associated with branch data, used for an immediately preceding element placement operation, of the branch data extracted by said partial circuit data extraction means.

24. An apparatus according to any one of claims 17–20, wherein said element placement means includes a population of solutions generation means for using the branch data extracted by said partial circuit data extraction means and said overlapping data to generate a population of solutions including a plurality of solutions constituted by candidate values for predetermined first coordinates of all elements included in the branch data, second coordinate determination means for determining second coordinates perpendicular to the first coordinates of all elements associated with the population of solutions in units of solutions by a compaction operation, search means for searching a pair of elements for each solution of the population of solutions, of elements included in the adjacent branches, which have the first coordinates which are close to each other, in accordance with a predetermined probability, and adjustment means for, when a pair of elements which are close to each other are found, adjusting first coordinate values of the elements to be equal to each other.

25. An apparatus according to claim 24, wherein said adjustment means includes means for holding the values of the adjusted first coordinates until adjustment of first coordinates is performed with respect to a population of new solutions.

26. An apparatus according to claim 17, wherein said element placement means includes means for setting a sequence of numbers, as the solutions, obtained by arranging and coding candidate values for the first coordinates corresponding to elements included in the partial circuit as the placement target in accordance with an order in which branches are arranged from the first terminal and an order in which elements in each branch are arranged, said selection means includes means for performing an operation in accordance with probabilities determined on the basis of fitness associated with the solutions in units of solutions, said crossover means includes means for performing an operation in accordance with crossover ratios determined on the basis of an order in which branches are newly added to the partial circuit as the placement target by said partial circuit data extraction means in units of branches, and said mutation means includes means for performing an operation in accordance with mutation ratios determined on the basis of the order in units of branches.

27. An apparatus according to claim 17, wherein said element placement means includes selection means for selecting a predetermined number of solutions of the next population from the population consisting of the predetermined number of solutions, said selection means including evaluation means for evaluating a plurality of costs including at least a first cost associated with an element placement area and a second cost associated with a positional relationship between elements in units of the first solutions, first generation means for calculating a selection probability of each of the first solutions by using a predetermined function on the basis of the first cost to select a plurality of second solutions larger in number than a predetermined number from the population of first solutions and generating a population of second solutions including the second solutions, second generation means for calculating a selection probability of each of the second solutions by using a predetermined function on the basis of the second cost to select a plurality of third solutions larger in number than the first solutions and smaller in number than the second solutions from the population of second solutions, and generating a population of third solutions including the third solutions, and means for repeatedly operating said second generation means until a population of final solutions are generated with reference to all costs.

28. An apparatus according to claim 27, wherein said element placement means includes second coordinate determination means for determining second coordinates of all elements associated with the population of first solutions in units of the first solutions by a compaction operation prior to execution of an operation of said evaluation means, crossover means for selectively forming solution pairs equal to half the number of solutions included in the population of last solutions after execution of an operation of said third generation means, and exchanging components between solutions constituting each of the solution pairs, mutation means for performing a predetermined arithmetic operation with respect to a predetermined component of each of the solutions which have undergone the exchange to generate a population of new solutions, and means for repeating operations of the second coordinate determination means to said mutation means, a predetermined number of times, with respect to a population of new solutions generated by said mutation means.

29. An apparatus according to claim 27 or 28, wherein said evaluation means includes means for evaluating a cost associated with adjacency of elements, a cost associated with an element area, and a cost associated with a wire length.

30. An apparatus according to claim 21, wherein said second coordinate determination means includes means for determining a second coordinate of each element associated with the solution by a compaction operation.

31. An apparatus according to claim 19 or 20, further comprising means for setting the first and second positive integers $\underline{m}$ and $\underline{n}$, set by said set means, as values which locally vary.

32. An LSI element placement apparatus for placing elements in accordance with an order in which branches are arranged, each branch being constituted by an element array included in a circuit diagram having first and second terminals, comprising:

means for dividing the circuit diagram into a plurality of partial circuits, each constituted by a plurality of branches; and processing means for simultaneously applying genetic algorithms to element placement of the respective partial circuits, wherein said processing means includes means for obtaining fitness used for the genetic algorithms with respect to the respective partial circuits with reference to information about a connection relationship between elements of each partial circuit as a placement target, and information about a placement result based on a best solution every predetermined number of generations of the immediately left partial circuit as a placement target.

33. An apparatus according to claim 32, wherein said processing means includes
   means for arranging and coding first coordinates by using a genetic algorithm applied to each of the partial circuits as the placement targets, in units of branches, in accordance with an order in which elements are arranged, and
   means for determining a second coordinate of each element which is perpendicular to the first coordinate by performing a compaction operation with respect to a placement result based on a best solution determined every predetermined number of generations of an immediately preceding partial circuit as a placement target.

* * * * *